United States Patent
Lee et al.

(10) Patent No.: US 10,706,753 B2
(45) Date of Patent: Jul. 7, 2020

(54) DISPLAY DEVICE

(71) Applicant: SAMSUNG DISPLAY CO., LTD., Yongin-si, Gyeonggi-do (KR)

(72) Inventors: Won Se Lee, Seoul (KR); Ae Shin, Seoul (KR); Won Kyu Kwak, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 94 days.

(21) Appl. No.: 15/838,631

(22) Filed: Dec. 12, 2017

(65) Prior Publication Data
US 2019/0027076 A1 Jan. 24, 2019

(30) Foreign Application Priority Data
Jul. 18, 2017 (KR) .......................... 10-2017-0091080

(51) Int. Cl.
*G09G 3/00* (2006.01)
*G02F 1/1345* (2006.01)
(Continued)

(52) U.S. Cl.
CPC ........... *G09G 3/006* (2013.01); *G02F 1/1309* (2013.01); *G02F 1/13306* (2013.01);
(Continued)

(58) Field of Classification Search
CPC .......... G09G 3/22; G09G 3/3208; G09G 3/30; G09G 3/3225; G09G 3/3233;
(Continued)

(56) References Cited

U.S. PATENT DOCUMENTS 8,963,818 B2  2/2015  Kim et al.
2003/0090448 A1*  5/2003  Tsumura ........... G02F 1/134363
345/87

(Continued)

FOREIGN PATENT DOCUMENTS

| EP | 3 001 404 | 3/2016 |
| KR | 10-2007-0077988 | 7/2007 |
| KR | 10-0870663 | 11/2008 |
| KR | 10-1033463 | 5/2011 |

OTHER PUBLICATIONS

European Search Report issued in corresponding application No. 18151552.9 dated Jul. 10, 2018.

*Primary Examiner* — William Lu
(74) *Attorney, Agent, or Firm* — F. Chau & Associates, LLC

(57) ABSTRACT

A display device includes: a first substrate including a display area and a non-display area adjacent to the display area, wherein the display area includes a plurality of pixels; an output pad unit disposed in the non-display area and including an inspection pad and a driving voltage pad; a driving integrated circuit (IC) disposed in the non-display area and including an inspection bump; a driving voltage line electrically connected to the plurality of pixels and the driving voltage pad; and an inspection line having a first connection line and a second connection line, wherein the first connection line is electrically connected to the inspection pad and the inspection bump, and the second connection line is electrically connected to the inspection bump and partially overlaps the driving voltage line.

20 Claims, 26 Drawing Sheets

(51) Int. Cl.

| | | |
|---|---|---|
| *G02F 1/13* | (2006.01) | |
| *G02F 1/133* | (2006.01) | |
| *G02F 1/1362* | (2006.01) | |
| *G09G 3/3208* | (2016.01) | |
| *G09G 3/36* | (2006.01) | |
| *H01L 21/66* | (2006.01) | |
| *H01L 23/60* | (2006.01) | |
| *H01L 27/32* | (2006.01) | |
| *H01L 51/00* | (2006.01) | |
| *H01L 51/52* | (2006.01) | |
| *G02F 1/1368* | (2006.01) | |
| *G02F 1/1333* | (2006.01) | |

(52) U.S. Cl.
CPC .... *G02F 1/13452* (2013.01); *G02F 1/136213* (2013.01); *G09G 3/3208* (2013.01); *G09G 3/3611* (2013.01); *H01L 22/32* (2013.01); *H01L 23/60* (2013.01); *H01L 27/3276* (2013.01); *H01L 51/0097* (2013.01); *H01L 51/5253* (2013.01); *G02F 1/1368* (2013.01); *G02F 2001/133302* (2013.01); *G02F 2201/121* (2013.01); *G02F 2201/123* (2013.01); *G09G 2300/0426* (2013.01); *G09G 2330/12* (2013.01); *H01L 2251/5338* (2013.01)

(58) Field of Classification Search
CPC .. G09G 3/3241; G09G 3/3266; G09G 3/3275; G09G 3/3258
See application file for complete search history.

(56) References Cited

U.S. PATENT DOCUMENTS

| | | | |
|---|---|---|---|
| 2003/0174480 A1* | 9/2003 | Matsuhira | G02F 1/13452 361/764 |
| 2005/0248012 A1* | 11/2005 | Furihata | G02F 1/1345 257/678 |
| 2006/0103410 A1* | 5/2006 | Jeon | G09G 3/006 324/760.02 |
| 2006/0170447 A1* | 8/2006 | Maeda | G09G 3/006 324/760.01 |
| 2006/0175713 A1* | 8/2006 | Aramatsu | G02F 1/13452 257/786 |
| 2010/0052713 A1* | 3/2010 | Kunimori | G09G 3/006 324/754.01 |
| 2011/0050657 A1* | 3/2011 | Yamada | H01L 27/3293 345/204 |
| 2012/0169578 A1* | 7/2012 | Kim | G09G 3/3688 345/93 |
| 2014/0111724 A1* | 4/2014 | Nishino | G02F 1/1309 349/43 |
| 2014/0176498 A1* | 6/2014 | Yanase | G06F 3/044 345/174 |
| 2014/0368228 A1* | 12/2014 | Kim | G02F 1/1309 324/750.3 |
| 2016/0172428 A1* | 6/2016 | Song | H01L 27/3276 257/99 |
| 2016/0179229 A1* | 6/2016 | Ahn | G06F 3/041 345/173 |
| 2017/0285376 A1* | 10/2017 | Okamae | H01L 27/124 |

* cited by examiner

DISPLAY DEVICE

This application claims priority under 35 U.S.C. § 119 to Korean Patent Application No. 10-2017-0091080 filed on Jul. 18, 2017 in the Korean Intellectual Property Office, the disclosure of which is incorporated by reference herein in its entirety.

TECHNICAL FIELD

The present invention relates to a display device.

DESCRIPTION OF THE RELATED ART

Display devices are seeing increased use as multimedia technology evolves. A variety of types of display devices such as a liquid-crystal display (LCD) and an organic light-emitting display (OLED) are currently used.

An LCD is one of the most broadly used flat panel display devices. An LCD includes two substrates on which electrodes for generating an electric field are formed. The electrodes may include pixel electrodes and common electrodes. A liquid-crystal layer is interposed between the two substrates. A voltage is applied to the electrodes to form the electric field in the liquid-crystal layer. This way, the orientation of the liquid crystals in the liquid-crystal layer is aligned and the polarization of incident light is controlled, thereby enabling the display of images.

An organic light-emitting display displays images by using organic light-emitting diodes (OLEDs). Such an organic light-emitting display has fast response speed, high luminance, a large viewing angle, and low power consumption.

SUMMARY

An exemplary embodiment of the present invention discloses a display device including: a first substrate including a display area and a non-display area adjacent to the display area, wherein the display area includes a plurality of pixels; an output pad unit disposed in the non-display area and including an inspection pad and a driving voltage pad; a driving integrated circuit (IC) disposed in the non-display area and including an inspection bump; a driving voltage line electrically connected to the plurality of pixels and the driving voltage pad; and an inspection line having a first connection line and a second connection line, wherein the first connection line is electrically connected to the inspection pad and the inspection bump, and the second connection line is electrically connected to the inspection bump and partially overlaps the driving voltage line.

An exemplary embodiment of the present invention discloses a display device including: a first substrate including a display area and a non-display area adjacent to the display area, wherein the display area includes a display; an output pad unit disposed in the non-display area and including an inspection pad; a driving IC disposed in the non-display area between the output pad unit and the display and including an inspection bump; and an inspection line disposed in the non-display area and electrically connected to the inspection bump, wherein the inspection line includes a first connection line and a second connection line, wherein the first connection line is electrically connected to the inspection bump with the inspection pad, and the second connection line extends away from the inspection bump to an area between the driving IC and the display.

BRIEF DESCRIPTION OF THE DRAWINGS

The above and other features of the present invention will become more apparent by describing in detail exemplary embodiments thereof with reference to the attached drawings, in which.

DETAILED DESCRIPTION OF THE EMBODIMENTS

Figure 1:
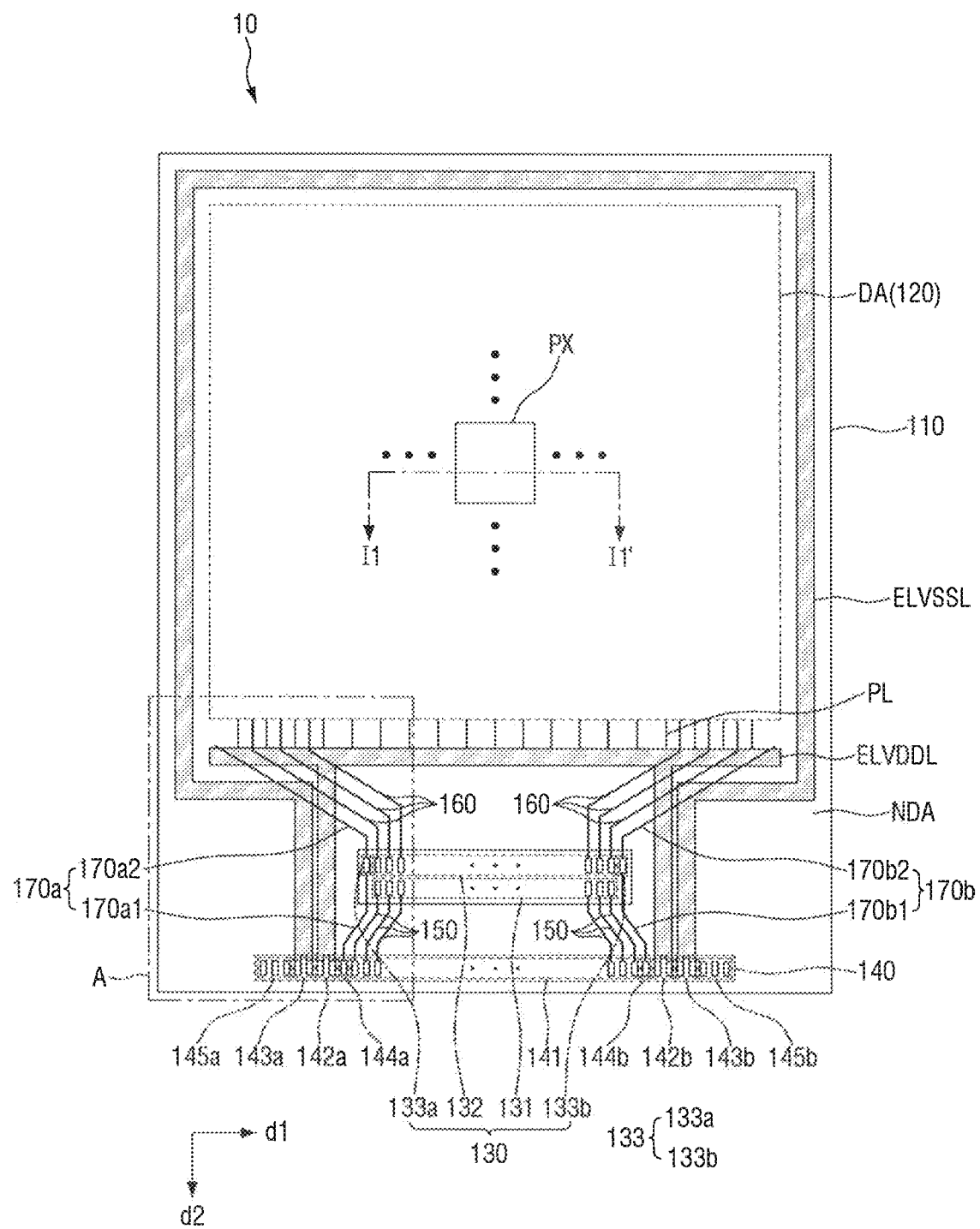
FIG. 1 is a plan view of a display device according to an exemplary embodiment of the present invention.

Exemplary embodiments of the present invention will be described more fully hereinafter with reference to the accompanying drawings. However, the present invention is not limited to the exemplary embodiments disclosed herein but may be implemented in various different ways.

It will be understood that when an element or layer is referred to as being "on" another element or layer, the element or layer can be directly on another element or layer or intervening elements or layers may also be present.

Like reference numerals may designate like elements throughout the specification.

Figure 2:
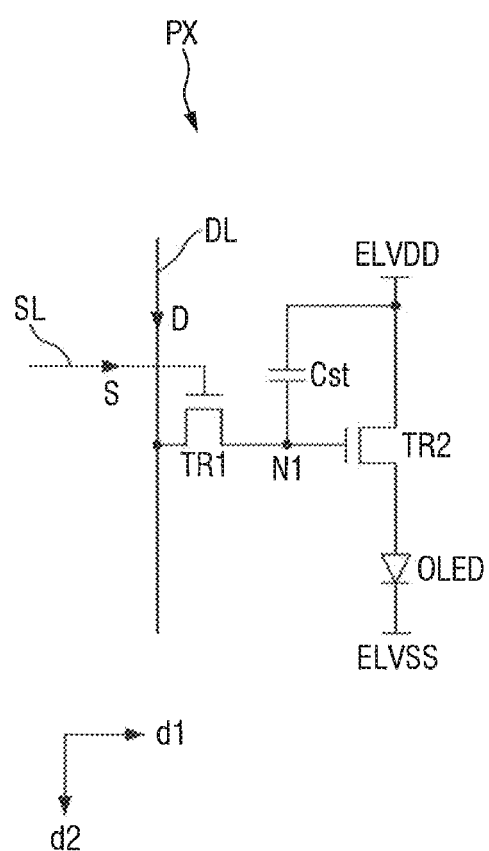
FIG. 2 is an equivalent circuit diagram of a pixel shown in FIG. 1 according to an exemplary embodiment of the present invention.

FIG. 1 is a plan view of a display device according to an exemplary embodiment of the present invention. FIG. 2 is an equivalent circuit diagram of a pixel shown in FIG. 1 according to an exemplary embodiment of the present invention.

Referring to FIG. 1, a display device 10 according to an exemplary embodiment of the present invention may include a first substrate 110, a display 120, a driver integrated circuit (IC) 130, and an output pad unit 140.

The first substrate 110 may be an insulative substrate. In an exemplary embodiment of the present invention, the first substrate 110 may include a material such as glass, quartz and a polymeric resin. The polymer material may be polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof.

The material of the first substrate 110 may vary depending on the direction in which light exits the display device 10. In an exemplary embodiment of the present invention, when an image is displayed as light exits toward the first substrate 110, the first substrate 110 is formed of a transparent material. When an image is displayed as light exits away from the first substrate 110, the first substrate 110 may not be formed of a transparent material. In an exemplary embodiment of the present invention, the first substrate 110 may include: iron, chromium, manganese, nickel, titanium, molybdenum, invar alloy, or stainless steel (SUS).

The first substrate 110 may include a display area DA and a non-display area NDA.

The display area DA is an area for displaying an image. The display 120 is disposed on the display area DA. On the display 120, a plurality of pixels PX for reproducing an image is arranged. Hereinafter, an example of one of the plurality of pixels PX will be described first with reference to FIG. 2.

The pixel PX may include a first switching element TR1, a second switching element TR2, a storage capacitor Cst, and an organic light-emitting diode OLED. In other words, the display device 10 according to the present exemplary embodiment may be an organic light-emitting display device.

The first switching element TR1 may include a control electrode (e.g., first electrode) electrically connected to a scan line SL extending in a first direction d1, another electrode (e.g., second electrode) connected to a data line DL extending in a second direction d2, and yet another electrode (e.g., third electrode) electrically connected to a first node N1. The first switching element TR1 may perform a switching operation based on a scan signal S received via the scan line SL and supply a data signal D received via the data line DL to the first node N1. In other words, the first switching element TR1 may be a switch transistor. The first direction d1 may intersect with the second direction d2, for example. In FIG. 2, the first direction d1 refers to a row direction, while the second direction d2 refers to a column direction.

The second switching element TR2 may include a control electrode (e.g., fourth electrode) electrically connected to the first node N1, another electrode (e.g., fifth electrode) electrically connected to a first driving voltage line ELVDDL (see FIG. 1) for providing a first driving voltage ELVDD, and yet another electrode (e.g., sixth electrode) electrically connected to a second driving voltage line ELVSSL (see FIG. 1) for providing a second driving voltage ELVSS. The first driving voltage ELVDD and the second driving voltage ELVSS are direct current (DC) voltages. The second driving voltage ELVSS has a voltage level lower than that of the first driving voltage ELVDD.

Accordingly, the second switching element TR2 performs a switching operation based on the data signal D supplied from the first switching element TR1 to control the amount of driving current flowing to the organic light-emitting diode OLED. In other words, the second switching element TR2 may be a driving transistor.

The storage capacitor Cst may include an electrode electrically connected to the first node N1, and another electrode electrically connected to the first driving voltage line ELVDDL for providing the first driving voltage ELVDD. The storage capacitor Cst may store charges in proportion to the voltage difference between the voltage at the first node N1 and the first driving voltage ELVDD.

It is to be noted that the elements included in the pixel PX and the connective relationship between the elements is not limited to those shown in FIG. 2. In an exemplary embodiment of the present invention, the pixel PX may further include a plurality of switching elements to compensate for a threshold voltage of the second switching element TR2, deterioration of the organic light-emitting diode OLED, and the like.

Referring back to FIG. 1, the non-display area NDA is an area that is disposed outside the display area DA and does not display an image. The non-display area NDA may surround the display area DA, for example. Although the non-display area NDA is shown as surrounding the display area DA in FIG. 1, this is merely illustrative. For example, the non-display area NDA may be disposed adjacent to only one side of the display area DA or may be disposed adjacent to first and second sides of the display area DA.

The driver or driving IC 130 may be disposed on the non-display area NDA. For example, the driving IC 130 may be disposed between the display area DA and the output pad unit 140. The driving IC 130 may be mounted directly on the first substrate 110. Although only one driving IC 130 is shown in FIG. 1, this is merely illustrative. More than one driving IC may be disposed on the non-display area NDA.

The driver IC 130 may generate a plurality of scan signals S (see FIG. 2) and/or a plurality of data signals D (see FIG. 2) based on a drive signal supplied from the output pad unit 140 and may provide the scan signals S and the data signals D to the plurality of pixels PX. In this case, a plurality of input lines 150 may be disposed on the first substrate 110 to electrically connect the output pad unit 140 with the driving IC 130. Further, a plurality of output lines 160 electrically connecting the driving IC 130 with the display 120 may be disposed on the first substrate 110.

The manner of electrically connecting the driving IC 130 with the plurality of input lines 150 and the manner of electrically connecting the driving IC 130 with the plurality of output lines 160 are not particularly limited. In an exemplary embodiment of the present invention, the driving IC 130 may be electrically connected to each of the plurality of input lines 150 and the plurality of output lines 160 using an anisotropic conductive film (ACF). For example, the ACF may include an adhesive resin and conductive particles dispersed in the adhesive resin.

The driving IC 130 may include a plurality of bump units. For example, the driving IC 130 may include an input bump unit 131 and an output bump unit 132.

The input bump unit 131 may include a plurality of input bumps spaced apart from one another by a predetermined distance in the first direction d1. The input bump unit 131 may be electrically connected to the output pad unit 140 via the plurality of input lines 150. The input bump unit 131 may receive a driving signal from the output pad unit 140 via the plurality of input lines 150.

The output bump unit 132 includes a plurality of output bumps spaced apart from one another by a predetermined distance in the first direction d1. The output bump unit 132 may be spaced apart from the input bump unit 131 by a predetermined distance in the second direction d2. The output bump unit 132 may be electrically connected to the display 120 via the plurality of output lines 160. In other words, the output bump unit 132 may provide the display 120 with the scan signals S and/or the data signals D via the plurality of output lines 160.

The driving IC 130 may further include an inspection bump unit 133. The inspection bump unit 133 may include a first inspection bump 133a disposed on one side of the output bump unit 132, and a second inspection bump 133b disposed on the other side of the output bump unit 132. The first inspection bump 133a may be electrically connected to a first inspection line 170a. The second inspection bump 133b may be electrically connected to a second inspection line 170b. The inspection bump unit 133, the first inspection line 170a and the second inspection line 170b will be described later with reference to FIG. 3.

In an exemplary embodiment of the present invention, the output pad unit 140 may be disposed such that it extends in the first direction d1 along the edge of the first substrate 110. The output pad unit 140 is electrically connected to a printed circuit board (PCB). The PCB may be a flexible printed circuit (FPC), for example. When the PCB is an FPC, the area of a dead space outside the display 120 can be reduced by folding the FPC toward a back side of the first substrate 110.

The output pad unit 140 may include a first pad unit 141, a second pad unit 142a and 142b, a third pad unit 143a and 143b, a fourth pad unit 144a and 144b, and a fifth pad unit 145a and 145b.

The first pad unit 141 may include a plurality of first pads for receiving driving signals for controlling the driving IC 130 from the above-described PCB. The first pad unit 141 may be electrically connected to the plurality of input lines 150. Thus, the first pad unit 141 may be a pad for applying signals.

The second pad unit 142a and 142b may include a second pad 142a located on one side of the first pad unit 141 and a second pad 142b located on the other side of the first pad unit 141. The second pad unit 142a and 142b may be electrically connected to the first driving voltage line ELVDDL. In other words, the second pad unit 142a and 142b may receive the first driving voltage ELVDD from the outside and provide it to the first driving voltage line ELVDDL.

The third pad unit 143a and 143b may include a third pad 143a located on one side of the first pad unit 141 and a third pad 143b located on the other side of the first pad unit 141. The third pad unit 143a and 143b may be electrically connected to the second driving voltage line ELVSSL. In other words, the third pad unit 143a and 143b may receive the second driving voltage ELVSS from the outside and provide it to the second driving voltage line ELVSSL.

In other words, the second pad unit 142a and 142b and the third pad unit 143a and 143b may be driving voltage pad units. It is to be noted that the number and arrangement of the pads for applying the driving voltage are not limited to those shown in FIG. 1.

The fourth pad unit 144a and 144b may include a fourth pad 144a located on one side of the first pad unit 141 and a fourth pad 144b located on the other side of the first pad unit 144. The fourth pad unit 144a and 144b may be electrically connected to the inspection bump unit 133. For example, the fourth pad 144a may be electrically connected to the first inspection bump 133a via the first inspection line 170a. The fourth pad 144b may be electrically connected to the second inspection bump 133b via the second inspection line 170b. The fourth pad unit 144a and 144b may be electrically connected to the inspection bump unit 133 via the first inspection line 170a and the second inspection line 170b. This way, it can be determined whether there is an error in the output of the driving IC 130. Thus, the fourth pad unit 144a and 144b may be a pad unit for inspection. The fifth pad units 145a and 145b may include a fifth pad 145a located on one side of the first pad unit 141 and a fifth 145b located on the other side of the first pad unit 141. For example, the driving IC 130 and a plurality of driving signal lines electrically connected to a driving circuit disposed on the display 120 may also be disposed on the first substrate 110. The fifth pad unit 145a and 145b may be electrically connected to the plurality of driving signal lines. In this case, a plurality of driving signal inspection lines may also be disposed on the first substrate 110. In other words, by using the fifth pad unit 145a and 145b, it is possible to check whether there is an error in the driving signal output from the driving IC 130 to the driving circuit.

Hereinafter, a way of checking the output from the driving IC 130 will be described with regard to the fourth pad 144a, the first inspection line 170a and the first inspection bump 133a located on one side of the first pad unit 141.

Figure 3:
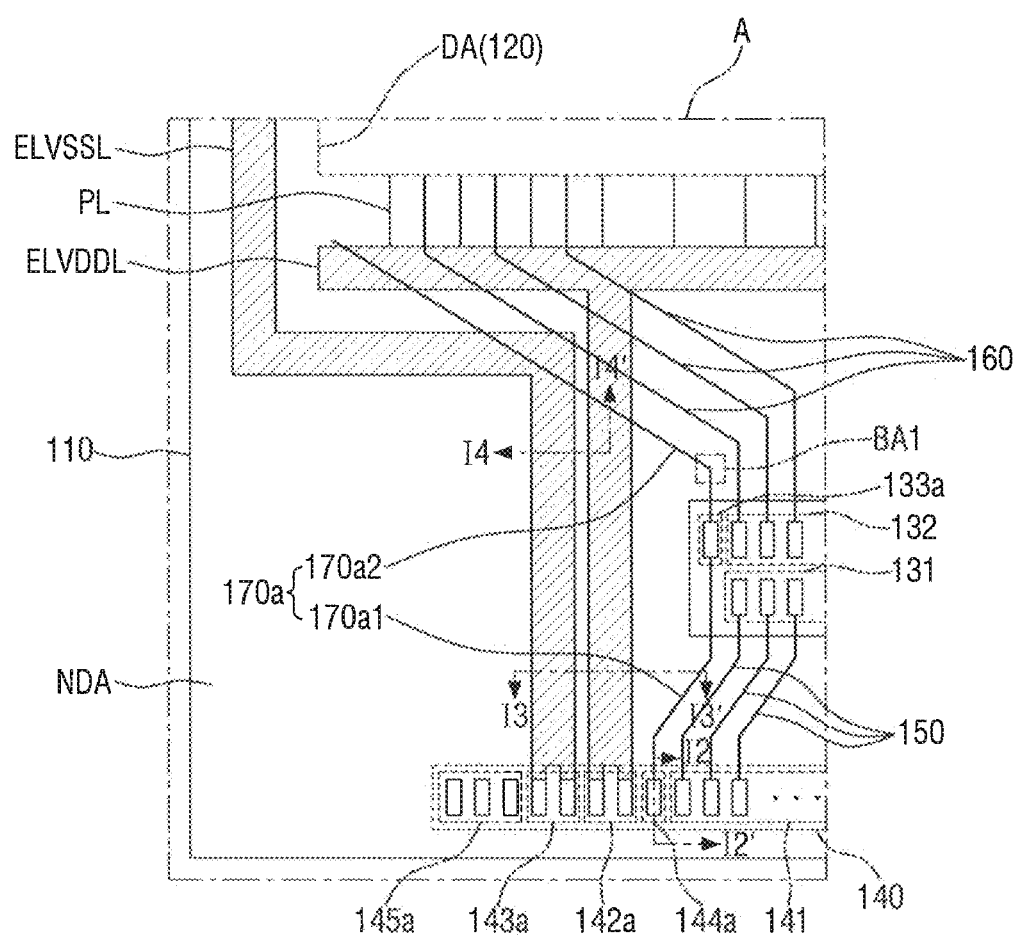
FIG. 3 is an enlarged view of area A shown in FIG. 1 according to an exemplary embodiment of the present invention.

FIG. 3 is an enlarged view of area A shown in FIG. 1 according to an exemplary embodiment of the present invention.

Referring to FIGS. 1 and 3, the first inspection line 170a may include a first connection line 170a1 and a second connection line 170a2. The first connection line 170a1 of the first inspection line 170a is a line that electrically connects the fourth pad 144a with the first inspection bump 133a. The second connection line 170a2 of the first inspection line 170a extends from the first connection line 170a1 toward the display 120, and is a line that at least partially overlaps the first driving voltage line ELVDDL and/or the second driving voltage line ELVSSL to be described below.

As used herein, a phrase "a first element overlaps a second element" may mean that the first element and the second element are disposed on different layers above the first substrate 110, and at least a part of the first element overlaps the second element in a direction perpendicular to the substrate 110.

In other words, since the second connection line 170a2 of the first inspection line 170a at least partial overlaps the first driving voltage line ELVDDL and/or the second driving voltage line ELVSSL, it can form a capacitor with the first driving voltage line ELVDDL and/or the second driving voltage line ELVSSL. A detailed description thereof will be made below.

First, the first connection line 170a1 of the first inspection line 170a will be described.

The fourth pad 144a may receive an inspection signal from the first inspection bump 133a of the driving IC 130 via the first connection line 170a1 of the first inspection line 170a. It is possible to check whether there is an error in the output of the driving IC 130 based on the inspection signal provided to the fourth pad 144a. In an exemplary embodiment of the present invention, by comparing the waveform of the inspection signal provided from the driving IC 130 via the first connection line 170a1 of the first inspection line 170a to the waveform of a predetermined signal, it is possible to determine whether there is an error in the output of the driving IC 130.

To check if there is an error in the output of the driving IC 130, the first inspection bump 133a may be disposed adjacent to the output bump unit 132. In an exemplary embodiment of the present invention, no other bump may be disposed between the first inspection bump 133a and the output bump unit 132. In other words, by disposing the first inspection bump 133a adjacent to the output bump unit 132, it is possible to more accurately check whether there is an error in the signals provided to the display 120 from the driving IC 130.

It is to be noted that the number and arrangement of the inspection bumps included in the inspection bump unit 133, the number and arrangement of the fourth pads included in the fourth pad unit 144a and 144b, etc. are not limited to those shown in FIGS. 1 and 3.

Next, the second connection line 170a2 of the first inspection line 170a will be described. However, prior to describing the second connection line 170a2, the first driving voltage line ELVDDL and the second driving voltage line ELVSSL will be described.

As described above, the output pad unit 140 may provide the input bump unit 131 with a driving signal for controlling the driving IC 130, wherein the driving signal is provided from the PCB. In addition, the driving IC 130 may also provide the display 120 with a signal for displaying an image via the output bump unit 132.

It is to be noted that the output pad unit 140 may supply a first driving voltage ELVDD and a second driving voltage ELVSS directly to the display 120 without passing through the driving IC 130. To accomplish this, the first driving voltage line ELVDDL and the second driving voltage line ELVSSL may be disposed between the output pad unit 140 and the display 120. In other words, the first driving voltage line ELVDDL and the second driving voltage line ELVSSL may be bypass lines.

The first driving voltage line ELVDDL may provide the display 120 with the first driving voltage ELVDD provided from the output pad unit 140, for example, the second pad units 142a and 142b. The first driving voltage line ELVDDL may include a plurality of auxiliary lines PL. The plurality of auxiliary lines PL is electrically connected to the first driving voltage line ELVDDL. The plurality of auxiliary lines PL provides the first driving voltage ELVDD supplied from the first driving voltage line ELVDDL to each of the plurality of pixels PX included in the display 120. To accomplish this, the plurality of auxiliary lines PL may be electrically connected to each of the plurality of pixels PX.

The first driving voltage line ELVDDL may be disposed on the first substrate 110 such that it at least partially surrounds the non-display area NDA. In an exemplary embodiment of the present invention, the first driving voltage line ELVDDL may be disposed on one side of the display area DA, as shown in FIG. 1.

The second driving voltage line ELVSSL may provide the display 120 with the second driving voltage ELVSS provided from the output pad unit 140, for example, the third pad unit 143a and 143b. In an exemplary embodiment of the present invention, the second driving voltage line ELVSSL may be electrically connected to a common electrode 280 (see FIG. 4) in the non-display area NDA, such that it may provide the common electrode 280 with the second driving voltage ELVSS. The common electrode 280 will be described later.

The second driving voltage line ELVSSL may be disposed on the first substrate 110 such that it at least partially surrounds the non-display area NDA. In an exemplary embodiment of the present invention, the second driving voltage line ELVSSL may surround almost all four sides of the display area DA, as shown in FIG. 1.

In exemplary embodiment of the present invention, the first driving voltage line ELVDDL and the second driving voltage line ELVSSL may be formed on the same layer. The first driving voltage line ELVDDL may be isolated from the second driving voltage line ELVSSL. Accordingly, to prevent a short-circuit between the first driving voltage line ELVDDL and the second driving voltage line ELVSSL, the second driving voltage line ELVSSL may be, in an exemplary embodiment of the present invention, disposed away from the driving voltage line ELVDDL.

The second connection line 170a2 of the first inspection line 170a will now be described.

As described above, the first connection line 170a1 of the first inspection line 170a connects the fourth pad 144a with the first inspection bump 133a to check whether there is an error in the output of the driving IC 130. In addition, to increase the accuracy of the inspection, in an exemplary embodiment of the present invention, the first inspection bump 133a may be disposed adjacent to the output bump unit 132. If, however, a relatively large amount of charges are applied to the first connection line 170a1 of the first inspection line 170a due to the introduction of static electricity, the static electricity may flow into the output bump unit 132 adjacent to the first inspection bump 133a. If this happens, a plurality of scan signals S and/or a plurality of data signals D provided to the display 120 can be affected, and consequently, the display quality of the display 120 can deteriorate.

The first inspection line 170a further includes the second connection line 170a2 extending from the first connection line 170a1 toward the display 120. In other words, the first inspection line 170a may further include the second connection line 170a2, thereby extending the overall length of the inspection line. The resistance of the inspection line is proportional to the length of the line, for example.

Accordingly, the first inspection line 170a includes the second connection line 170a2 extending from the first connection line 170a1, thereby increasing the resistance of the entire first inspection line 170a. By doing so, a structure robust against static electricity or a large amount of electric charges can be implemented. Therefore, static electricity that may flow into the output bump unit 132 can be suppressed. In an exemplary embodiment of the present invention, the resistance of the entire first inspection line 170a may be equal to or greater than approximately 1 kΩ.

In addition, the second connection line 170a2 of the first inspection line 170a may overlap at least a part of the first driving voltage line ELVDDL and/or the second driving voltage line ELVSSL. If the second connection line 170a2 of the first inspection line 170a overlaps the first driving voltage line ELVDDL, the first inspection line 170a may further include a capacitor formed between the second connection line 170a2 and the first driving voltage line ELVDDL. In addition, if the second connection line 170a2 of the first inspection line 170a overlaps the second driving voltage line ELVSSL, the first inspection line 170a may further include a capacitor formed between the second connection line 170a2 and the second driving voltage line ELVSSL. Moreover, if the second connection line 170a2 of the first inspection line 170a overlaps the first driving voltage line ELVDDL and the second driving voltage line ELVSSL, the first inspection line 170a may further include two capacitors. For example, a first capacitor formed between the second connection line 170a2 and the first driving voltage line ELVDDL, and a second capacitor formed between the second connection line 170a2 and the second driving voltage line ELVSSL. In the following description with respect to FIGS. 1 to 6, it is assumed that the second connection line 170a2 of the first inspection line 170a overlaps both of the first driving voltage line ELVDDL and the second driving voltage line ELVSSL.

In other words, the first inspection line 170a includes the second connection line 170a2, thereby increasing the overall capacitance of the first inspection line 170a. By doing so, a structure robust against static electricity or a large amount of electric charges can be implemented. Therefore, static electricity that may flow into the output bump unit 132 can be suppressed. In an exemplary embodiment of the present invention, the capacitance of the entire first inspection line 170a may be equal to or greater than approximately 0.05 pf.

Therefore, in the display device 10 according to an exemplary embodiment of the present invention, the first inspection line 170a includes the second connection line 170a2, so that the resistance and capacitance of the first inspection line 170a can be increased, thereby implementing the structure robust against static electricity. In this case, no additional circuit is required to prevent static electricity, and thus, the space of the non-display area NDA can be more efficiently utilized.

It is to be noted that the arrangement of the second connection line 170a2 of the first inspection line 170a, the size and location of the area where the second connection line 170a2 overlaps the first driving voltage line ELVDDL and/or the second driving voltage line ELVSSL, etc. are not limited to those shown in FIG. 1. The aforementioned structure that is robust against static electricity or the like has the resistance value of approximately 1 kΩ or more, or has the capacitance of approximately 0.05 pf or more, by virtue of the entire first inspection line 170a.

Hereinafter, the stack structure of the first inspection line 170a, the first driving voltage line ELVDDL and the second driving voltage line ELVSSL, and the width of the first inspection line 170a and the like will be described in more detail. For convenience of illustration, the stack structure of the elements disposed in the display area DA will be described first with reference to a cross-sectional view of the pixel PX taken along line I1-I1' shown in FIG. 1.

According to another embodiment of the present invention, the first inspection bump 133a may not be disposed adjacent to an edge of the output bump unit 132. For example, the first inspection bump 133a may be located to the right of the output bump unit 132 shown in FIG. 3.

Figure 4:
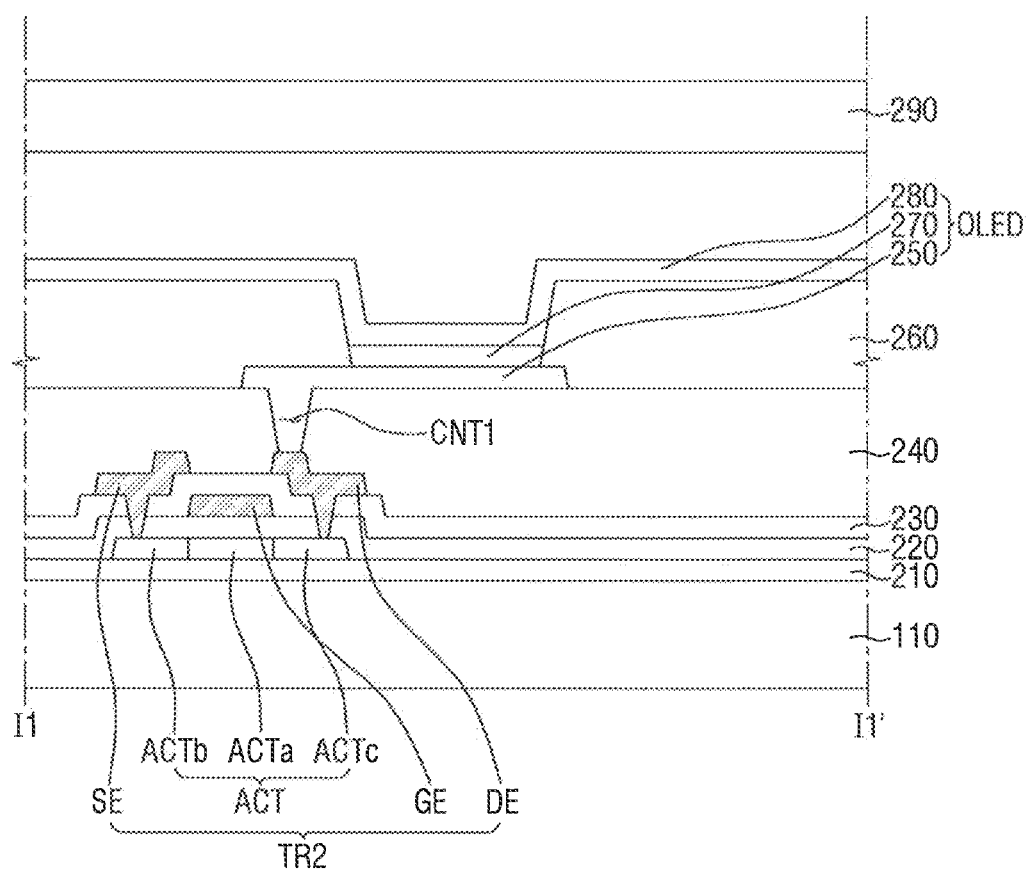
FIG. 4 is a cross-sectional view taken along line I1-I1' shown in FIG. 1 according to an exemplary embodiment of the present invention.

FIG. 4 is a cross-sectional view taken along line I1-I1' shown in FIG. 1 according to an exemplary embodiment of the present invention. The elements already described above with respect to FIGS. 1 to 3 may not be described again. In the cross-sectional view shown in FIG. 4, the second switching element TR2 and the organic light-emitting diode OLED electrically connected to the second switching element TR2, which are described above with reference to FIG. 2, will be mainly described.

Referring to FIG. 4, a buffer layer 210 may be disposed on the first substrate 110. The buffer layer 210 may be disposed on the first substrate 110. The buffer layer 210 may prevent moisture and oxygen from permeating into the first substrate 110. In addition, the buffer layer 210 may provide a flat surface over the first substrate 110. In an exemplary embodiment of the present invention, the buffer layer 210 may include a silicon nitride (SiNx) layer, a silicon oxide (SiO$_2$) layer, or a silicon oxynitride (SiOxNy) layer. The buffer layer 210 may not be used depending on the type of the first substrate 110, process conditions, etc.

A semiconductor layer including a semiconductor pattern ACT may be disposed on the buffer layer 210. The semiconductor pattern ACT will be described as an example of the semiconductor layer. In an exemplary embodiment of the present invention, the semiconductor pattern ACT may be made of polycrystalline silicon, single crystal silicon, low-temperature polycrystalline silicon, amorphous silicon, or an oxide semiconductor or a mixture thereof. In an exemplary embodiment of the present invention, the semiconductor pattern ACT may include a channel region ACTa doped with no impurity, and a source region ACTb and a drain region ACTc doped with impurities. The source region ACTb is located on one side of the channel region ACTa and is electrically connected to a source electrode SE described later. The drain region ACTc is located on the other side of the channel region ACTa and is electrically connected to a drain electrode DE described later.

A first insulating layer 220 may be disposed on the semiconductor layer including the semiconductor pattern ACT. In an exemplary embodiment of the present invention, the first insulating layer 220 may be a gate insulating layer. In an exemplary embodiment of the present invention, the first insulating layer 220 may be made of: an inorganic insulating material such as silicon oxide (SiOx) and silicon nitride (SiNx), BCB (BenzoCycloButene), an acryl-based material, or an organic insulating material such as polyimide, or a mixture thereof.

A gate conductor including a gate electrode GE may be disposed on the first insulating layer 220. The gate conductor may include the scan line SL shown in FIG. 2. The gate electrode GE may extend from the scan line SL and overlap the semiconductor pattern ACT. For example, the gate conductor may include an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), or tantalum (Ta).

A second insulating layer 230 may be disposed on the gate conductor including the gate electrode GE. The second insulating layer 230 may be made of: an inorganic insulating material such as silicon oxide (SiOx) and silicon nitride (SiNx), BCB (BenzoCycloButene), an acryl-based material, or an organic insulating material such as polyimide, or a mixture thereof.

A data conductor including the source electrode SE and the drain electrode DE may be disposed on the second insulating layer 230. The data conductor may include the first driving voltage line ELVDDL and the second driving voltage line ELVSSL shown in FIG. 1, and the data line DL shown in FIG. 2. The source electrode SE and the drain electrode DE are disposed on the second insulating layer 230 such that they are spaced apart from each other. The data conductor may include: a metal, an alloy, a metal nitride, a conductive metal oxide, or a transparent conductive material. In an exemplary embodiment of the present invention, the data conductor may have a single-layer structure or a multi-layer structure made of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), tantalum (Ta), etc. In addition, an alloy formed by adding titanium (Ti), zirconium (Zr), tungsten (W), tantalum (Ta), niobium (Nb), platinum (Pt), hafnium (Hf), oxygen (O) or nitrogen (N) to the above-listed metal may be used as the materials of the source electrode SE and the drain electrode DE.

The semiconductor pattern ACT, the gate electrode GE, the source electrode SE and the drain electrode DE described above form the second switching element TR2. Although the second switching element TR2 is shown as a top-gate transistor in FIG. 4, the type of the second switching element TR2 is not limited thereto. For example, the second switching element TR2 may be of a bottom gate type.

The material of the semiconductor pattern included in the first switching element TR1 may be different from that of the second switching element TR2. For example, a switching element including an oxide semiconductor and a switching element including low-temperature polysilicon both may be included in one pixel PX, depending on the functionality of the switching elements or the fabricating process.

A planarization layer 240 may be disposed on the data conductor. The planarization layer 240 can increase the luminous efficiency of a pixel electrode 250 and an organic emission layer 270, which will be described later, by removing the level difference. In an exemplary embodiment of the present invention, the planarization layer 240 may include an organic material. For example, the planarization layer 240 may include polyimide, polyacryl, or polysiloxane. In an exemplary embodiment of the present invention, the planarization layer 240 may include an inorganic material, or may be formed as a composite of an inorganic material and an organic material. A first contact hole CNT1 may be formed in the planarization layer 240 to expose at least a part of the drain electrode DE.

The pixel electrode 250 may be disposed on the planarization layer 240. The pixel electrode 250 may be electrically connected to the drain electrode DE exposed via the first contact hole CNT1. In other words, the pixel electrode 250 may be an anode which is a hole injection electrode. When the pixel electrode 250 is an anode electrode, the pixel electrode 250 may include a material having a high work function to facilitate hole injection. In addition, the pixel electrode 250 may be a reflective electrode, a transflective electrode, or a transmissive electrode. In an exemplary embodiment of the present invention, the pixel electrode 250 may include a reflective material. The reflective material may include, for example: silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), or magnesium-silver (Mg—Ag).

The pixel electrode 250 may be formed as a single layer, for example. In addition, the pixel electrode 250 may be made up of multiple layers in which two or more materials are stacked.

When the pixel electrode 250 is made up of multiple layers, the pixel electrode 250 may include, for example, a reflective layer and a transparent or translucent electrode disposed on the reflective layer. As another example, the pixel electrode 250 may include a reflective layer and a transparent or translucent electrode disposed under the reflective layer. For example, the pixel electrode 250 may have, but is not limited to, a three-layer structure of ITO/Ag/ITO.

The transparent or transflective electrode may be made of: indium tin oxide (ITO), indium zinc oxide (IZO), zinc oxide (ZnO), $In_2O_3$(Indium Oxide), indium gallium oxide (IGO), or aluminum zinc oxide (AZO).

A pixel defining layer 260 may be disposed on the pixel electrode 250. The pixel defining layer 260 includes an opening exposing at least a part of the pixel electrode 250. The pixel defining layer 260 may include an organic material or an inorganic material. In an exemplary embodiment of the present invention, the pixel defining layer 260 may include a material such as a photoresist, a polyimide resin, an acrylic resin, a silicon compound, or a polyacrylic resin.

The organic emission layer 270 may be disposed on the pixel electrode 250 and the pixel defining layer 260. For example, the organic emission layer 270 may be disposed on the portion of the pixel electrode 250 that is exposed via the opening of the pixel defining layer 260. In an exemplary embodiment of the present invention, the organic emission layer 270 may cover at least a part of the sidewall of the pixel defining layer 260.

In an exemplary embodiment of the present invention, the organic emission layer 270 may emit one of red, blue and green colors, for example. In an exemplary embodiment of the present invention, the organic emission layer 270 may emit white light or emit light of cyan, magenta or yellow. When the organic emission layer 270 emits white light, it may include a white light-emitting material, or may have a stack structure of a red light-emitting layer, a green light-emitting layer and a blue light-emitting layer to emit white light.

The common electrode 280 may be disposed on the organic emission layer 270 and the pixel defining layer 260. In an exemplary embodiment of the present invention, the common electrode 280 may be disposed throughout the organic emission layer 270 and the pixel defining layer 260. In an exemplary embodiment of the present invention, the common electrode 280 may be a cathode electrode. In an exemplary embodiment of the present invention, the common electrode 280 may include: Li, Ca, LiF/Ca, LiF/Al, Al, Ag or Mg. In addition, the common electrode 280 may be made of a material having a low work function. In an exemplary embodiment of the present invention, the common electrode 280 may be made of: indium tin oxide (ITO), indium zinc oxide (IZO), zinc oxide (ZnO), indium oxide ($In_2O_3$), indium gallium oxide (IGO), or aluminum zinc oxide (AZO).

The above-described pixel electrode 250, organic emission layer 270 and common electrode 280 may constitute the organic light-emitting diode OLED. However, this is merely illustrative. The organic light-emitting diode OLED may be a multiple layer structure further including a hole injection layer (HIL), a hole transport layer (HTL), an electron transport layer (ETL), and an electron injection layer (EIL).

A second substrate 290 may be disposed such that it faces the first substrate 110. The second substrate 290 may be coupled to the first substrate 110 by an additional sealing member. In an exemplary embodiment of the present invention, the second substrate 290 may be a transparent insulation substrate. When the second substrate 290 is a transparent insulation substrate, the transparent insulation substrate may be a glass substrate, a quartz substrate, a transparent resin substrate, or the like. A polarizing layer, an input sensing layer, and a window layer may be disposed on the second substrate 290.

The polarizing layer can reduce the reflectivity of external light incident from the outside. In an exemplary embodiment of the present invention, the polarizing layer may include a retarder and a polarizer. The polarizing layer may not be used. When the polarizing layer is not used, a black matrix BM and a color filter CF may be disposed on the second substrate 290 to increase color separation due to external light reflection.

In an exemplary embodiment of the present invention, the input sensing layer may be formed directly on the second substrate 290. In an exemplary embodiment of the present invention, the input sensing layer may be coupled to the second substrate 290 by an additional adhesive member.

Hereinafter, the stack structure of the first inspection line 170*a* will be described in more detail with reference to FIGS. 4 and 5.

Figure 5:
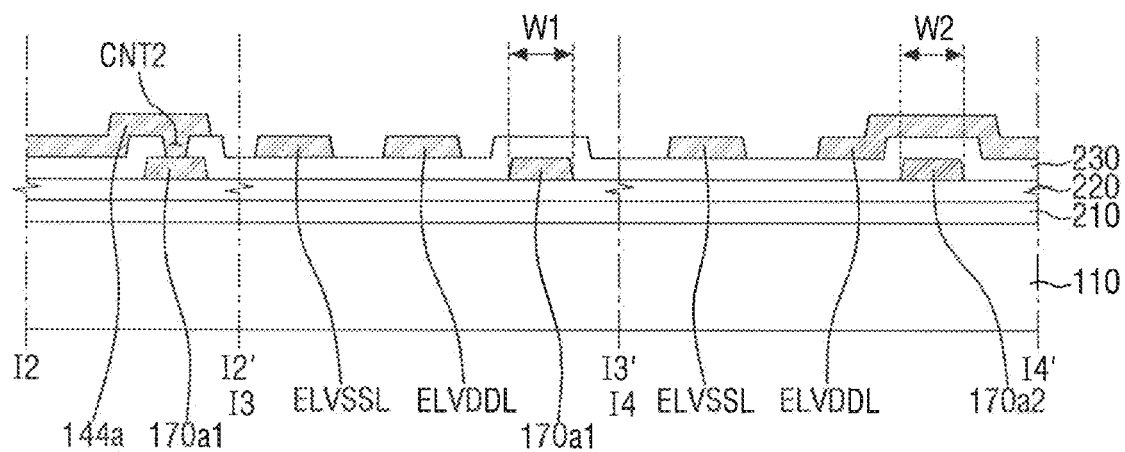
FIG. 5 is a cross-sectional view taken along lines I2-I2', I3-I3' and I4-I4' shown in FIG. 3 according to an exemplary embodiment of the present invention.

FIG. 5 is a cross-sectional view taken along lines I2-I2', I3-I3' and I4-I4' shown in FIG. 3 according to an exemplary embodiment of the present invention. For convenience of illustration, FIG. 5 mainly shows the first driving voltage line ELVDDL, the second driving voltage line ELVSSL, the fourth pad 144*a*, the first connection line 170*a*1 of the first inspection line 170*a*, and the second connection line 170*a*2 of the first inspection line 170*a*.

Referring to FIG. 5, the first inspection line 170*a* may be disposed on the first insulating layer 220. In other words, the first inspection line 170*a* may be disposed on the same layer as the gate conductor including the gate electrode GE. In an exemplary embodiment of the present invention, the first inspection line 170*a* may be formed together with the gate conductor via the same mask process.

The first driving voltage line ELVDDL and the second driving voltage line ELVSSL may be disposed on the second insulating layer 230. In other words, the first driving voltage line ELVDDL and the second driving voltage line ELVSSL may be disposed on the same layer as the data conductor including the source electrode SE and the drain electrode DE. In an exemplary embodiment of the present invention, the first driving voltage line ELVDDL and the second driving voltage line ELVSSL may be formed together with the data conductor via the same mask process.

The first driving voltage line ELVDDL and the second driving voltage line ELVSSL may be disposed on the first inspection line 170*a*. In exemplary embodiment of the present invention, the fourth pad 144*a* may be disposed on the same layer as the first driving voltage line ELVDDL and the second driving voltage line ELVSSL. In other words, since the fourth pad 144*a* is disposed on a different layer than the first inspection line 170*a*, a contact hole for electrically connecting the fourth pad 144*a* with the first inspection line 170*a* is formed.

In other words, a second contact hole CNT2 may be formed in the second insulating layer 230 to expose at least a part of the first connection line 170*a*1 of the first inspection line 170*a*. Accordingly, the fourth pad 144*a* is in direct contact with the first connection line 170*a*1 of the first inspection line 170*a* exposed via the second contact hole CNT2. It is to be noted that the fourth pad 144*a* may be connected to the first connection line 170*a*1 of the first inspection line 170*a* in various other ways. For example, the fourth pad 144*a* may be indirectly connected to the first connection line 170*a*1 of the first inspection line 170*a* using an additional bridge electrode.

The first connection line 170*a*1 of the first inspection line 170*a* may be disposed on a different layer from the first driving voltage line ELVDDL and the second driving voltage line ELVSSL so that it does not overlap with the first driving voltage line ELVDDL and the second driving voltage line ELVSSL. The second connection line 170*a*2 of the first inspection line 170*a* may overlap with at least a part of the first driving voltage line ELVDDL or the second driving voltage line ELVSSL.

In an exemplary embodiment of the present invention, the first inspection line 170*a* may have different widths. The width w1 of the first connection line 170*a*1 of the first inspection line 170*a* may be approximately 3 μm or more, for example. Further, the width w2 of the second connection line 170*a*2 of the first inspection line 170*a* may be approximately 2.5 μm or more. It is to be understood that this is merely illustrative. For example, the widths of the first connection line 170*a*1 and the second connection line 170*a*2 may be substantially the same.

The shape and the width of the first inspection line 170*a* are not particularly limited as long as the first inspection line 170*a* can achieve sufficient resistance and/or capacitance.

For example, in reference to FIG. 3, the first inspection line 170*a* may include a bent portion BA1. In an exemplary embodiment of the present invention, the bent portion BA1 may be formed at the second connection line 170*a*2 of the first inspection line 170*a*. The position and number of the bent portion BA1, and the resistance and capacitance of the first inspection line 170*a* may vary depending on connections with other elements, which are not particularly limited to those shown in FIGS. 1 and/or 3. Other examples of the first inspection line 170*a* will be described with reference to FIGS. 6A to 6C.

Figure 6A:
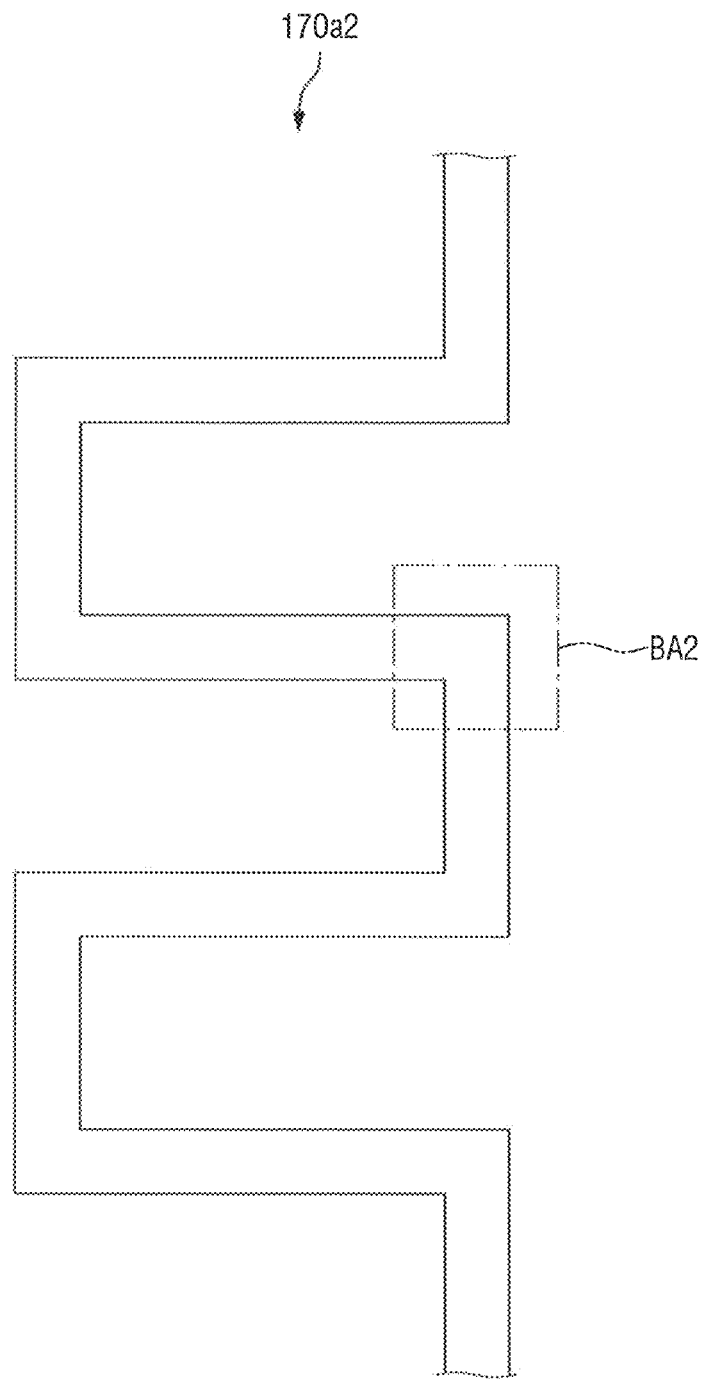
FIGS. 6A, 6B and 6C are plan views showing the second connection line of the first inspection line shown in FIG. 1 according to an exemplary embodiment of the present invention.
Figure 6B:
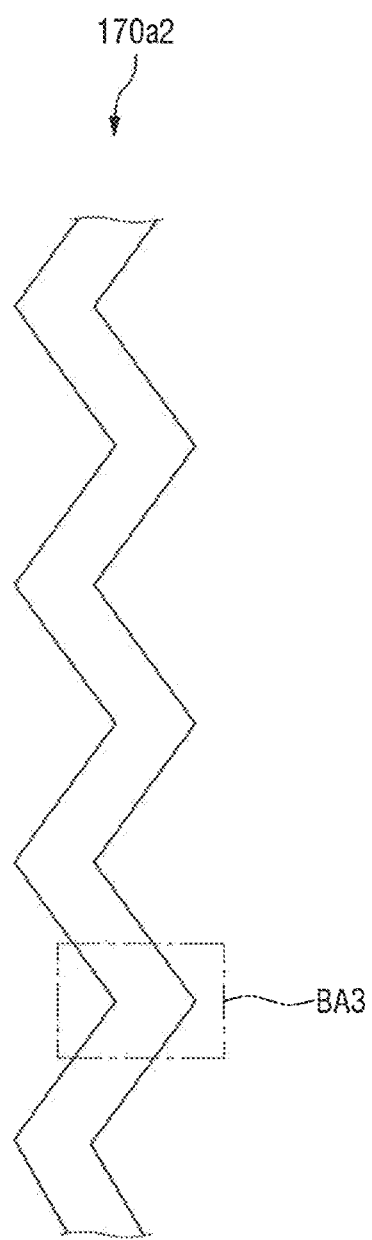
Figure 6C:
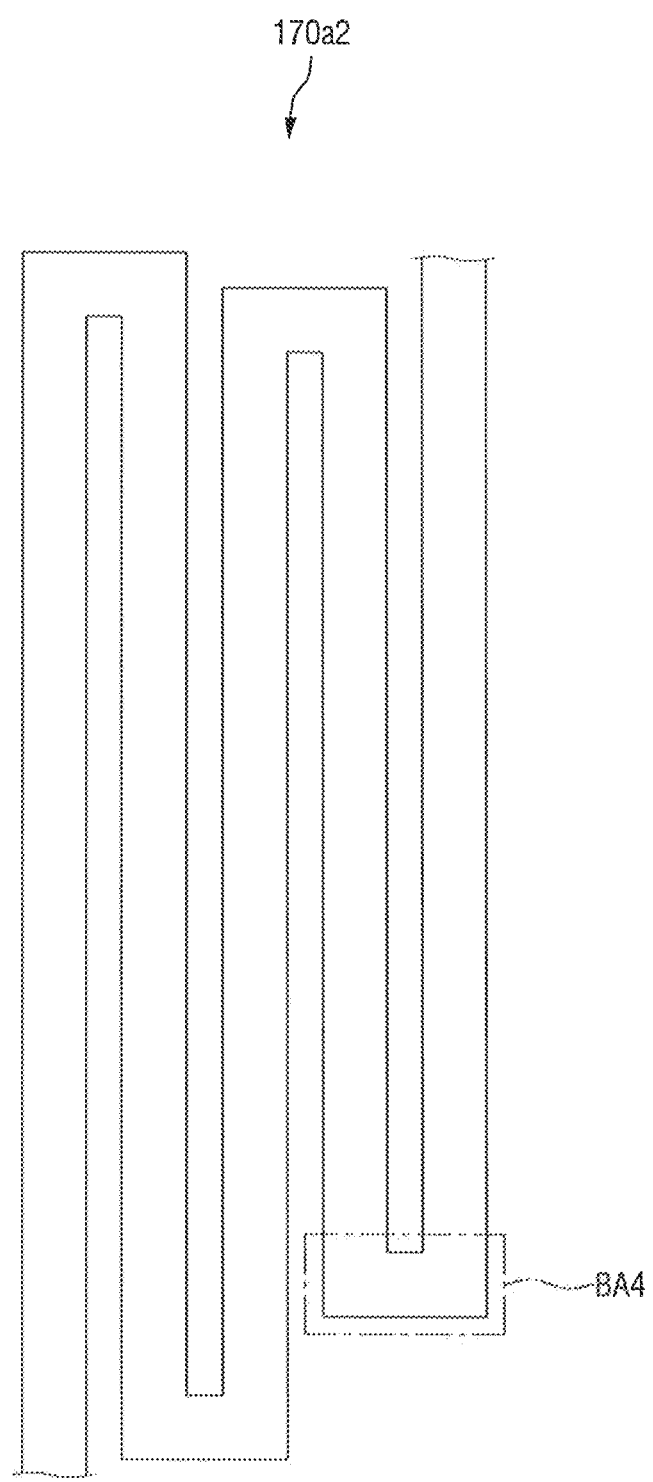

FIGS. 6A to 6C are plan views showing the second connection line of the first inspection line shown in FIG. 1 according to an exemplary embodiment of the present invention. For convenience of illustration, the second connection lines shown in FIGS. 6A to 6C are referred to as the second connection line 170*a*2.

Referring to FIGS. 6A, 6B and 6C, the second connection lines 170*a*2 may include bent portions BA2, BA3 and BA4, respectively. The bent portions BA2 to BA4 may be bent at right angle as shown in FIGS. 6A to 6C. However, the bent portions BA2 to BA4 are not limited to the bend angle shown in FIGS. 6A to 6C, for example, the bent portions BA2 to BA4 may have a rounded shape.

Although FIGS. 1 and 3 show that the second connection line 170*a*2 of the first inspection line 170*a* overlaps both the first driving voltage line ELVDDL and the second driving voltage line ELVSSL, this is merely illustrative. This will be described in more detail with reference to FIGS. 7 to 9.

Figure 7:
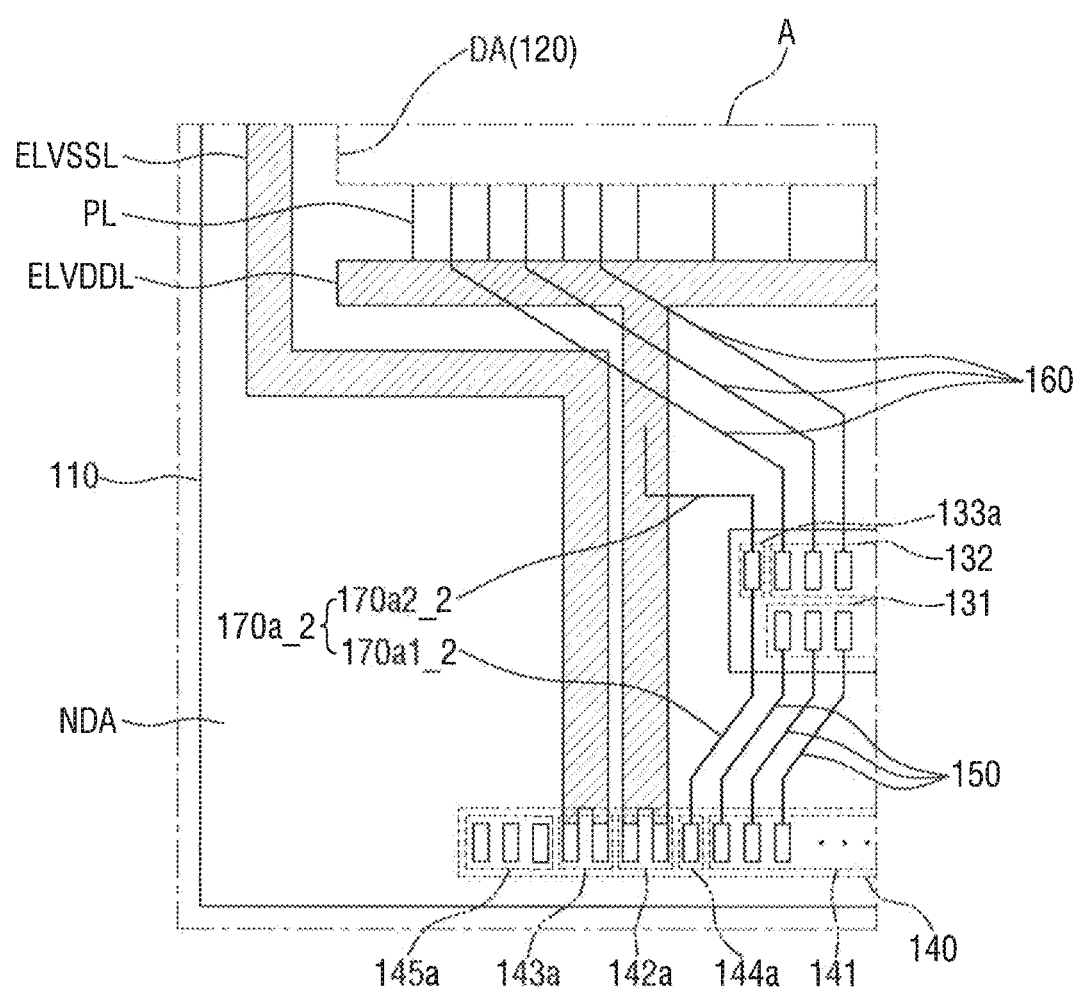
FIGS. 7, 8 and 9 are plan views of a display device according to an exemplary embodiment of the present invention.
Figure 8:
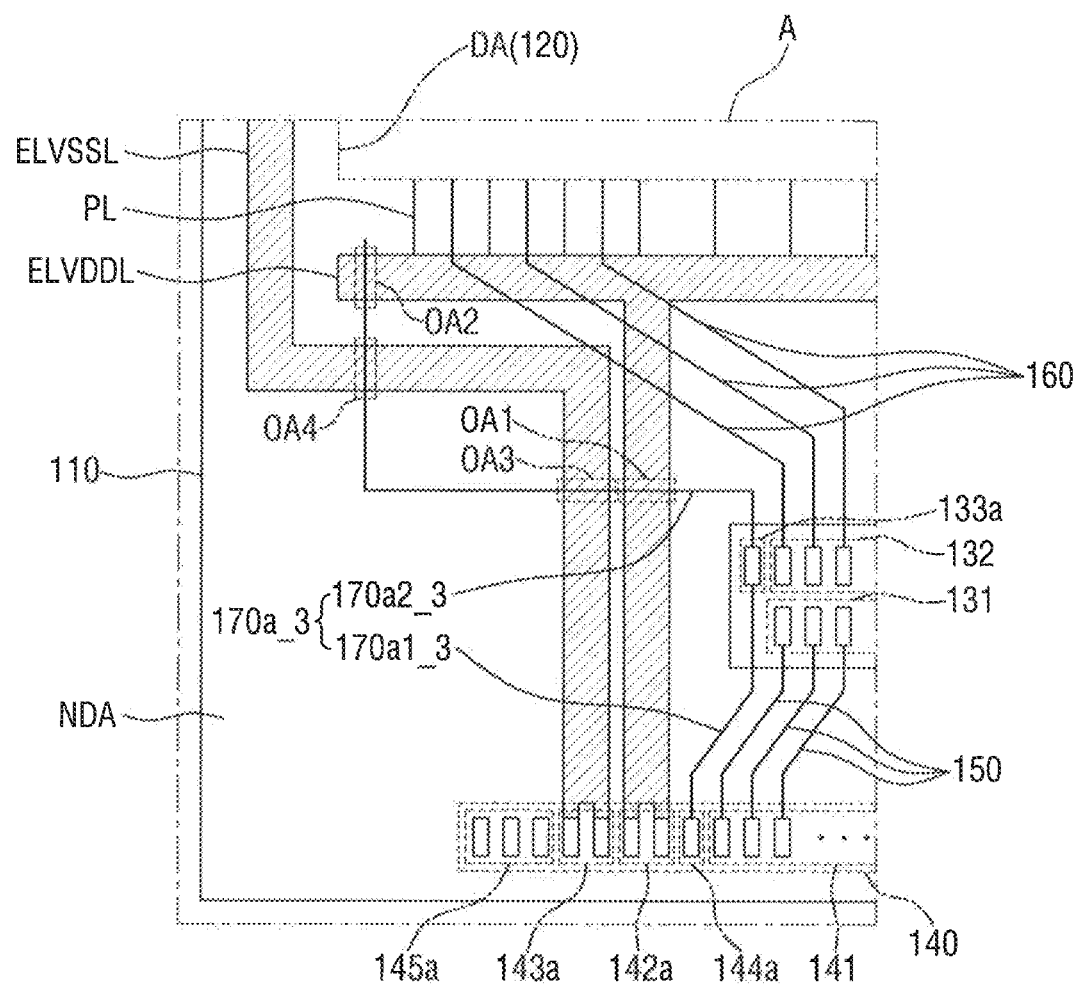
Figure 9:
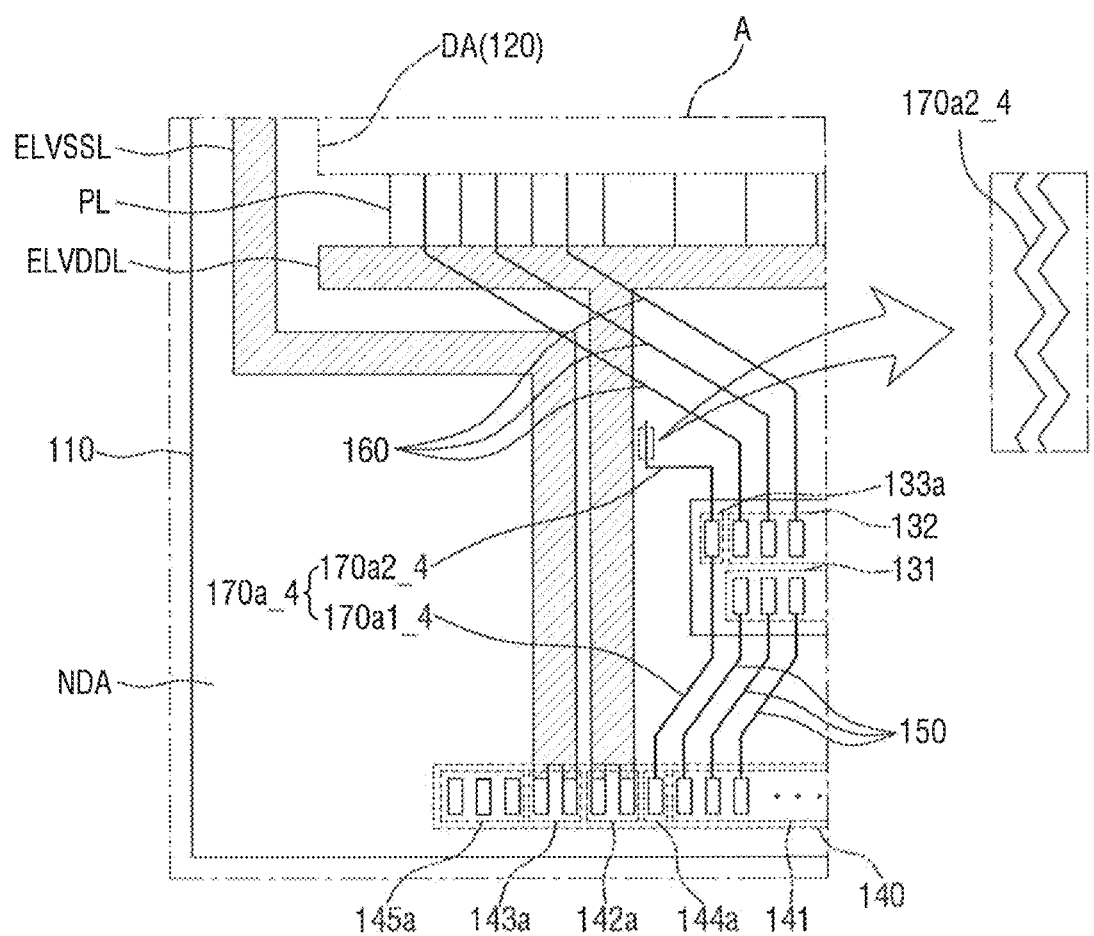

FIGS. 7 to 9 are plan views of a display device according to an exemplary embodiment of the present invention. FIGS. 7 to 9 are enlarged views of portions of display devices according to exemplary embodiments of the present invention, which are counterparts of the area A shown in FIG. 1. The elements already described above with respect to FIGS. 1 to 6 may not be described again. In the following description, like reference numerals may denote elements and/or features analogous to those described in reference to FIGS. 1 to 6.

Referring to FIG. 7, the second connection line 170*a*2__2 of the first inspection line 170*a*_2 overlaps the first driving voltage line ELVDDL but not the second driving voltage line ELVSSL. In other words, the second connection line 170*a*2_2 of the first inspection line 170*a*_2 does not overlap both the first driving voltage line ELVDDL and the second driving voltage line ELVSSL. The second connection line 170a2_2 of the first inspection line 170a_2 does not overlap the second driving voltage line ELVSSL, but instead increases the size of the area where it overlaps the first driving voltage line ELVDDL, thereby increasing capacitance. FIG. 7 also shows the first connection line 170a1_2 of the first inspection line 170a_2.

Referring to FIG. 8, the second connection line 170a2_3 of the first inspection line 170a_3 may overlap the first and second driving voltage lines ELVDDL and ELVSSL at a relatively large area. For example, the second connection line 170a2_3 of the first inspection line 170a_3 may overlap the first driving voltage line ELVDDL in a first area OA1 and a second area OA2. In addition, the second connection line 170a2_3 of the first inspection line 170a_3 may overlap the second driving voltage line ELVSSL in a third area OA3 and a fourth area OA4.

In other words, the first inspection line 170a_3 increases the size of the areas where the second connection line 170a2_3 overlaps the first driving voltage line ELVDDL and the second driving voltage line ELVSSL. Therefore, it is possible to obtain an increased capacitance of the first inspection line 170a_3. It is to be noted that the location, number and width of the area where the second connection line 170a2_3 overlaps the first and second driving voltage lines ELVDDL and ELVSSL are not limited to those shown in FIG. 8. FIG. 8 also shows the first connection line 170a1_3 of the first inspection line 170a_3.

Referring to FIG. 9, the second connection line 170a2_4 of the first inspection line 170a_4 may not overlap the first driving voltage line ELVDDL and the second driving voltage line ELVSSL. In this example, by further extending the length of the second connection line 170a2_4 of the first inspection line 170a_4, the resistance can be increased. Therefore, it is possible to implement a structure robust against static electricity. It is to be understood that the length of the second connection line 170a2__4 is extended by giving it a zig-zag shape shown in the blow out, for example. The shape of the second connection line 170a2_4 of the first inspection line 170a_4 is not limited to that shown in FIG. 9 as long as the first inspection line 170a_4 can achieve a sufficient or desired resistance. For example, the second connection line 170a2_4 may have a wave shape. FIG. 9 also shows the first connection line 170a1_4 of the first inspection line 170a_4.

Figure 10:
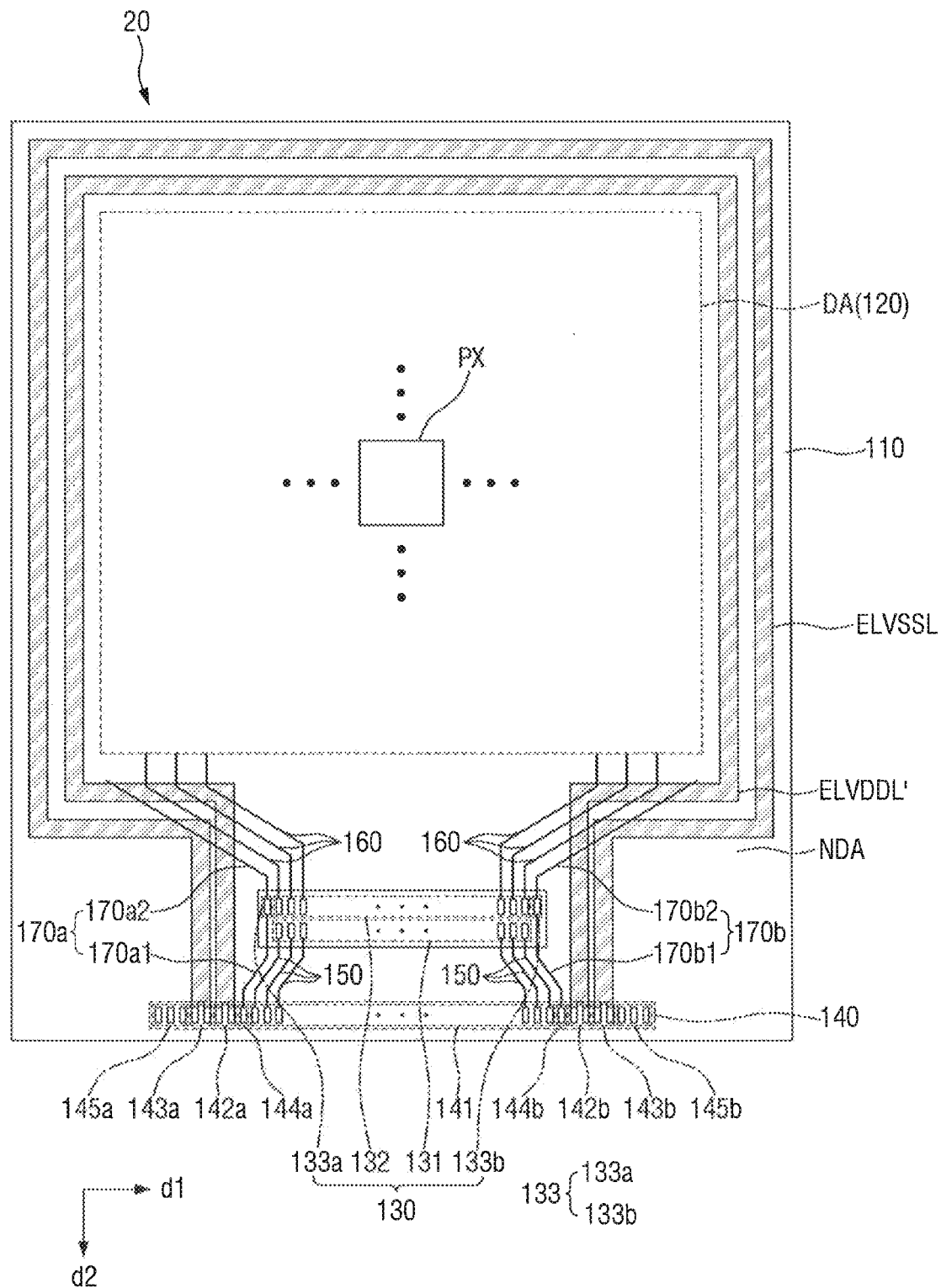
FIG. 10 is a plan view of a display device according to an exemplary embodiment of the present invention.

FIG. 10 is a plan view of a display device according to an exemplary embodiment of the present invention.

The display device 20 shown in FIG. 10 is different from the display device 10 shown in FIG. 1 in that a first driving voltage line ELVDDL' is differently arranged. The first driving voltage line ELVDDL' may be arranged at four sides of the display area DA, as shown in FIG. 10. In other words, each of the first driving voltage line ELVDDL' and the second driving voltage line ELVSSL may be arranged at four sides of the display area DA.

In an alternative embodiment, unlike that shown in FIG. 10, the first driving voltage line ELVDDL' may be disposed on the outer side of the second driving voltage line ELVSSL.

Figure 11:
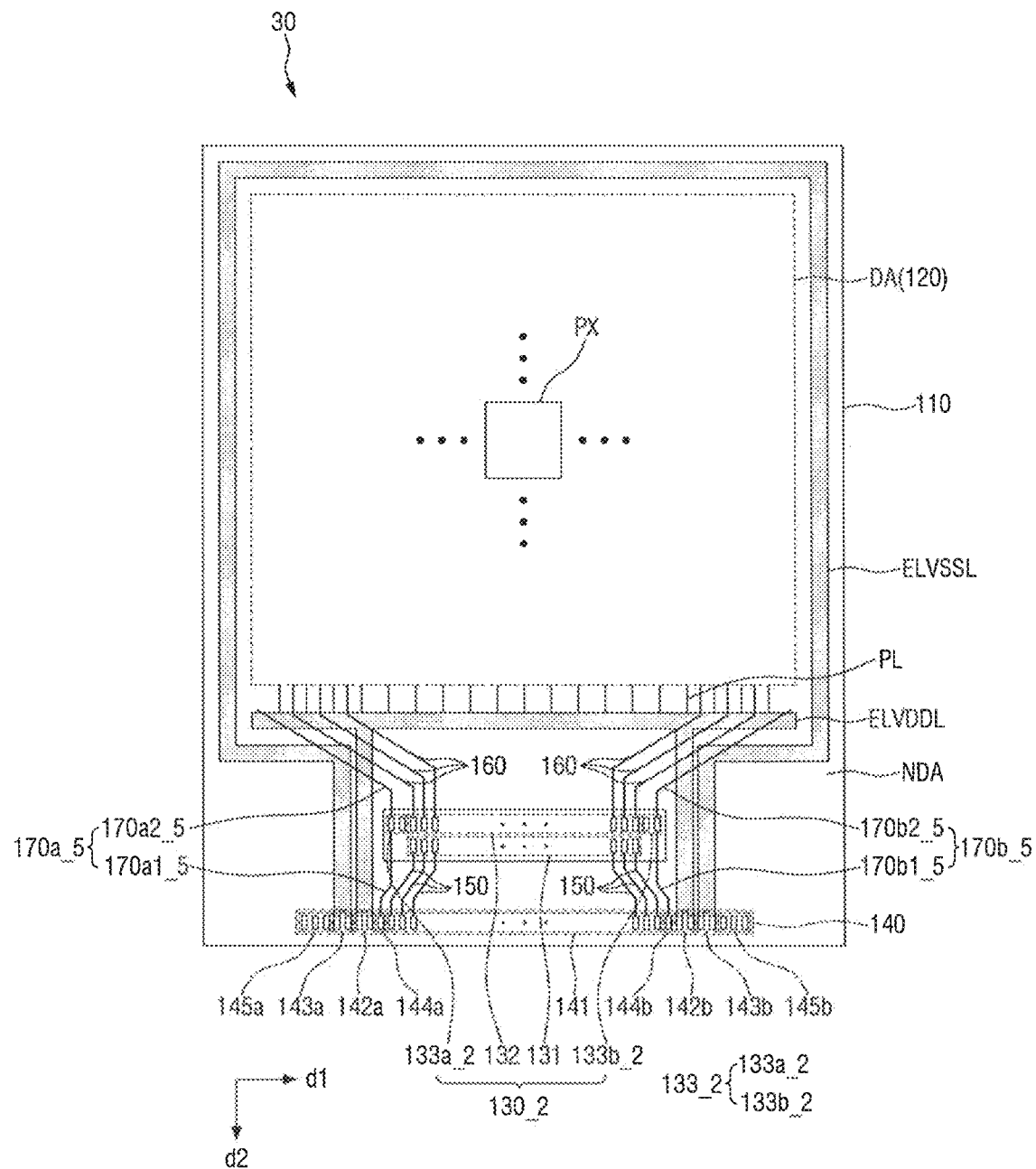
FIG. 11 is a plan view of a display device according to an exemplary embodiment of the present invention.

FIG. 11 is a plan view of a display device according to an exemplary embodiment of the present invention.

Referring to FIG. 11, the driving IC 130_2 may include an inspection bump unit 133_2 having first and second sub-inspection bumps 133a__2 and 133b_2. The display device 30 shown in FIG. 11 is different from the display device 10 shown in FIG. 1 in that the inspection bump unit 133_2 includes more bumps.

The first sub-inspection bump unit 133a_2 will be described as an example. The first sub-inspection bump unit 133a_2 may include a plurality of inspection bumps. Although FIG. 11 shows two inspection bumps, this is merely illustrative.

Each of a first connection line 170a1_5 and a second connection line 170a2_5 of a first inspection line 170a_5 may be electrically connected to one of the plurality of inspection bumps included in the first sub-inspection bump unit 133_2. The first inspection line 170a_5 may be electrically connected to the inspection bump disposed adjacent to the output bump unit 132. This way, the inspection accuracy of a signal output from the driver IC 130_2 may be increased.

It is to be noted that the first inspection line 170a_5 may be electrically connected to an inspection bump that is not disposed adjacent to the output bump unit 132, as shown in FIG. 11. For example, as long as the signal output from the driving IC 130_2 can be inspected accurately, the first inspection line 170a_5 may be connected to a non-adjacent inspection bump. FIG. 11 also shows a first connection line 170b1_5 and a second connection line 170b2_5 of a second inspection line 170b_5.

Figure 12:
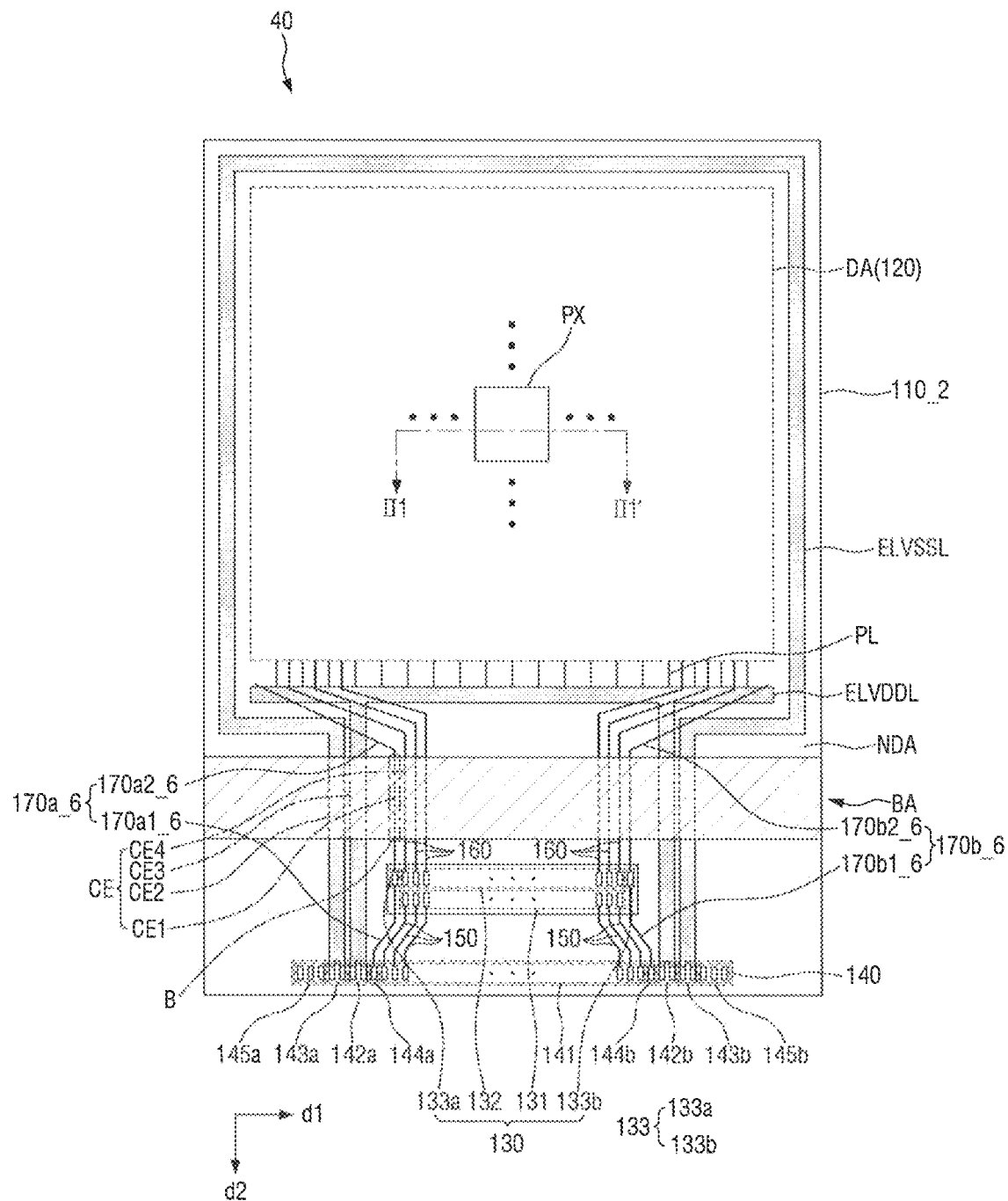
FIG. 12 is a plan view of a display device according to an exemplary embodiment of the present invention.
Figure 13:
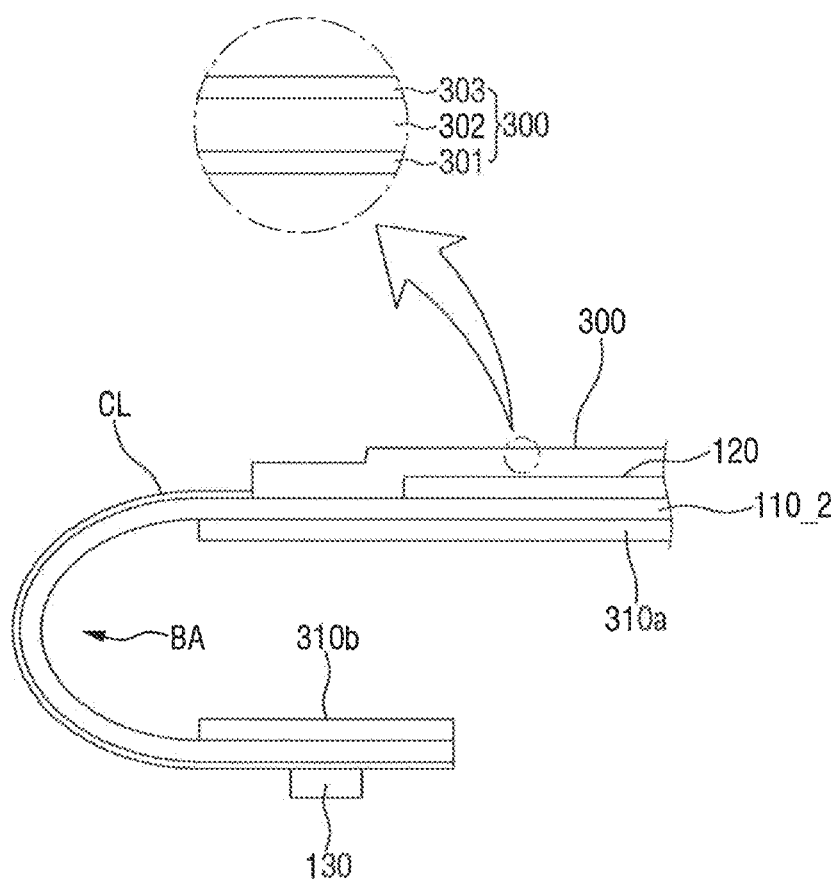
FIG. 13 is a side view of the display device shown in FIG. 12 bent along the bending area according to an exemplary embodiment of the present invention.

FIG. 12 is a plan view of a display device 40 according to an exemplary embodiment of the present invention. FIG. 13 is a side view of the display device 40 shown in FIG. 12 bent along a bending area BA.

Referring to FIGS. 12 and 13, a first substrate 110_2 may further include a bending area BA overlapping the non-display area NDA. The bending area BA is a portion that is bent around a bending axis located on the bending area BA. Accordingly, the first substrate 110_2 may be a flexible substrate. In an exemplary embodiment of the present invention, the first substrate 110_2 may be a flexible substrate including polyimide (PI). In an exemplary embodiment of the present invention, the bending area BA may be disposed between the display 120 and the driving IC 130. In other words, the display device 40 according to the present embodiment can be bent around a bending axis on the bending area BA. By doing this, a dead space outside the display 120 can be reduced.

Protective films 310a and 310b may be attached to the back surface of the first substrate 110_2 before bending the first substrate 110_2. In other words, when the protective films 310a and 310b are attached to the back surface of the first substrate 110_2 and the bending area BA is bent, a compressive stress may be applied to conductive lines CL disposed on the first substrate 110_2. As a result, it is possible to prevent cracks that may occur in the conductive lines CL.

An encapsulation layer 300 may be disposed to cover the display 120 disposed on the first substrate 110_2. The encapsulation layer 300 may be used instead of the second substrate 290 shown in FIG. 4. In an exemplary embodiment of the present invention, the encapsulation layer 300 may be made up of a single layer of an organic layer or an inorganic layer or may be made up of multiple stacked layers. FIG. 12 also shows a first connection line 170a1_6 and a second connection line 170a2_6 of a first inspection line 170a_6, and a first connection line 170b1_6 and a second connection line 170b2_6 of a second inspection line 170b_6.

Figure 14:
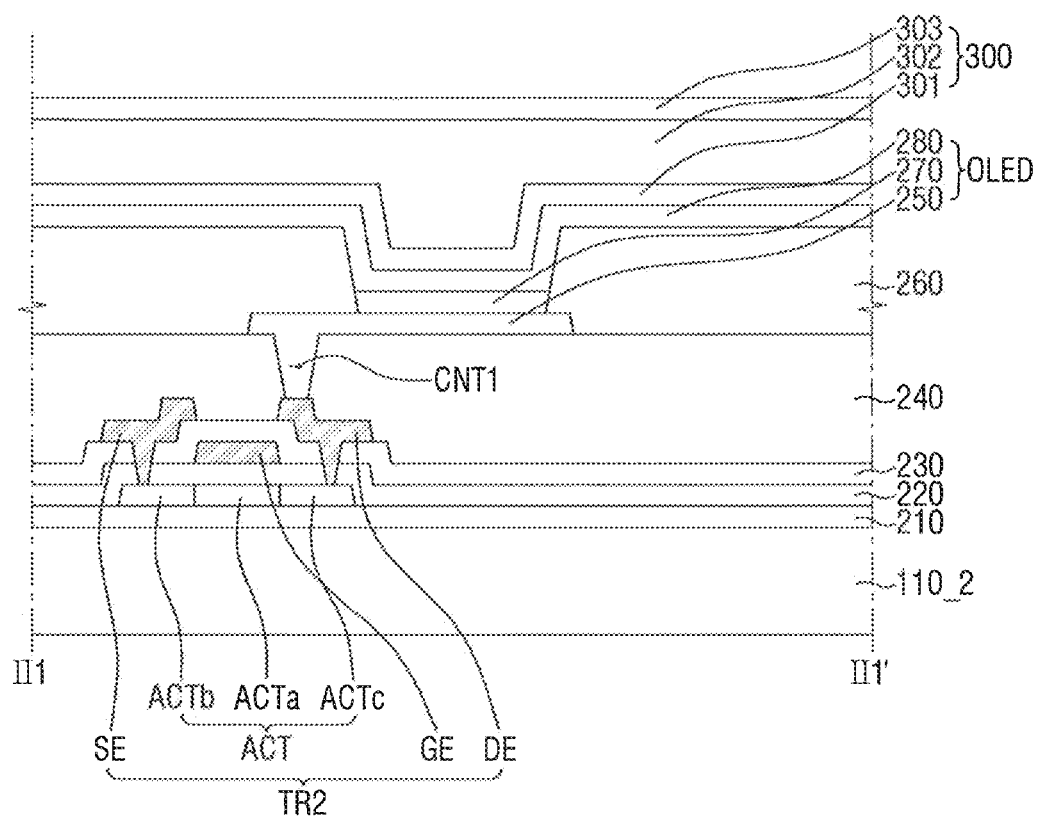
FIG. 14 is a cross-sectional view taken along line II1-II1' shown in FIG. 12 according to an exemplary embodiment of the present invention.

The arrangement of the encapsulation layer 300 will be described in more detail with reference to FIG. 14. FIG. 14 is a cross-sectional view taken along line III-III' shown in FIG. 12 according to an exemplary embodiment of the present invention.

Referring to FIG. 14, the encapsulation layer 300 can prevent moisture and air, which may flow from the outside, from permeating into the organic light-emitting diode OLED. In an exemplary embodiment of the present invention, the encapsulation layer 300 may include a first inorganic layer 301, an organic layer 302, and a second inorganic layer 303.

The first inorganic layer 301 may be disposed on the common electrode 280. The first inorganic layer 301 may include silicon oxide (SiOx), silicon nitride (SiNx), or silicon oxynitride (SiONx).

The organic layer 302 may be disposed on the first inorganic layer 301. The organic layer 302 may include epoxy, acrylate, or urethane acrylate. The organic layer 302 can provide a flat surface over the level difference created by the pixel defining layer 260.

The second inorganic layer 303 may be disposed on the organic layer 302. The second inorganic layer 303 may include silicon oxide (SiOx), silicon nitride (SiNx), or silicon oxynitride (SiONx).

Although each of the first inorganic layer 301, the organic layer 302 and the second inorganic layer 303 shown in FIGS. 13 and 14 is made up of a single layer, this is merely illustrative. In other words, at least one of the first inorganic layer 301, the organic layer 302 and the second inorganic layer 303 may be made up of multiple layers.

In an exemplary embodiment of the present invention, the encapsulation layer 300 may include a hexamethyldisiloxane (HMDSO) layer. For example, the encapsulation layer 300 may include the first inorganic layer 301, the second inorganic layer 303 and the HMDSO layer disposed between the first inorganic layer 301 and the second inorganic layer 303. In other words, the organic layer 302 may be replaced with the HMDSO layer.

In an exemplary embodiment of the present invention, the HMDSO layer may be formed in the same chamber after forming the first inorganic layer 301. By doing this, the process of forming the encapsulation layer 300 can be simplified. In addition, since the encapsulation layer 300 includes the HMDSO layer that is capable of absorbing stress, the encapsulation layer 300 can have sufficient flexibility.

In the bending area BA, a plurality of connection electrodes CE may be disposed for electrically connecting the conductive lines CL disposed between the output pad unit 140 and the display 120 or the conductive lines CL disposed between the driving IC 130 and the display 120. The plurality of connection electrodes CE may include first, second, third and fourth connection electrodes CE1, CE2, CE3 and CE4 electrically connected to the conductive lines CL disposed on the first substrate 110_2 in the bending area BA. The conductive lines CL may include a plurality of input lines 150, a plurality of output lines 160, the first inspection line 170a_6, the second inspection line 170b_6, a first driving voltage line ELVDDL, and a second driving voltage line ELVSSL disposed on the first substrate 110_2.

When tensile stress or compressive stress is applied to the bending area BA, there may be cracks in the conductive lines CL. To prevent such cracks, the conductive lines CL may further include the plurality of connection electrodes CE disposed in the bending area BA. The electrical connection between the plurality of connection electrodes CE and the conductive lines CL will be described later.

All of the connection electrodes CE are disposed on the same layer, and, for example, may be disposed on the same layer as the data conductor. In other words, the plurality of connection electrodes CE may be formed via the same mask process as the data conductor including the first driving voltage line ELVDDL and the second driving voltage line ELVSSL. It is to be noted that the phrase "the plurality of connection electrodes CE is formed on the same layer as the data conductor" may mean that they may be formed together via the same mask process. It should also be noted that this phrase does not necessarily mean that the elements disposed under the plurality of connection electrodes CE are identical to the elements disposed under the data conductor.

In addition, the conductive lines CL may also include lines which are not disposed on the same layer as the data conductor (for example, the first inspection line 170a_6). In other words, the first inspection line 170a_6 may also be electrically connected to the first connection electrode CE disposed in the same layer as the data conductor in the bending area BA. In this manner, a part of the first inspection line 170a_6 disposed on one side of the bending area BA may be electrically connected to a part of the first inspection line 170a_6 disposed on the other side of the bending area BA.

Hereinafter, the electrical connection between the plurality of connection electrodes CE and the conductive lines CL will be described with reference to FIGS. 15 and/or 16. The second connection line 170a2_6 of the first inspection line 170a_6 and the first connection electrode CE1 will be described as an example.

Figure 15:
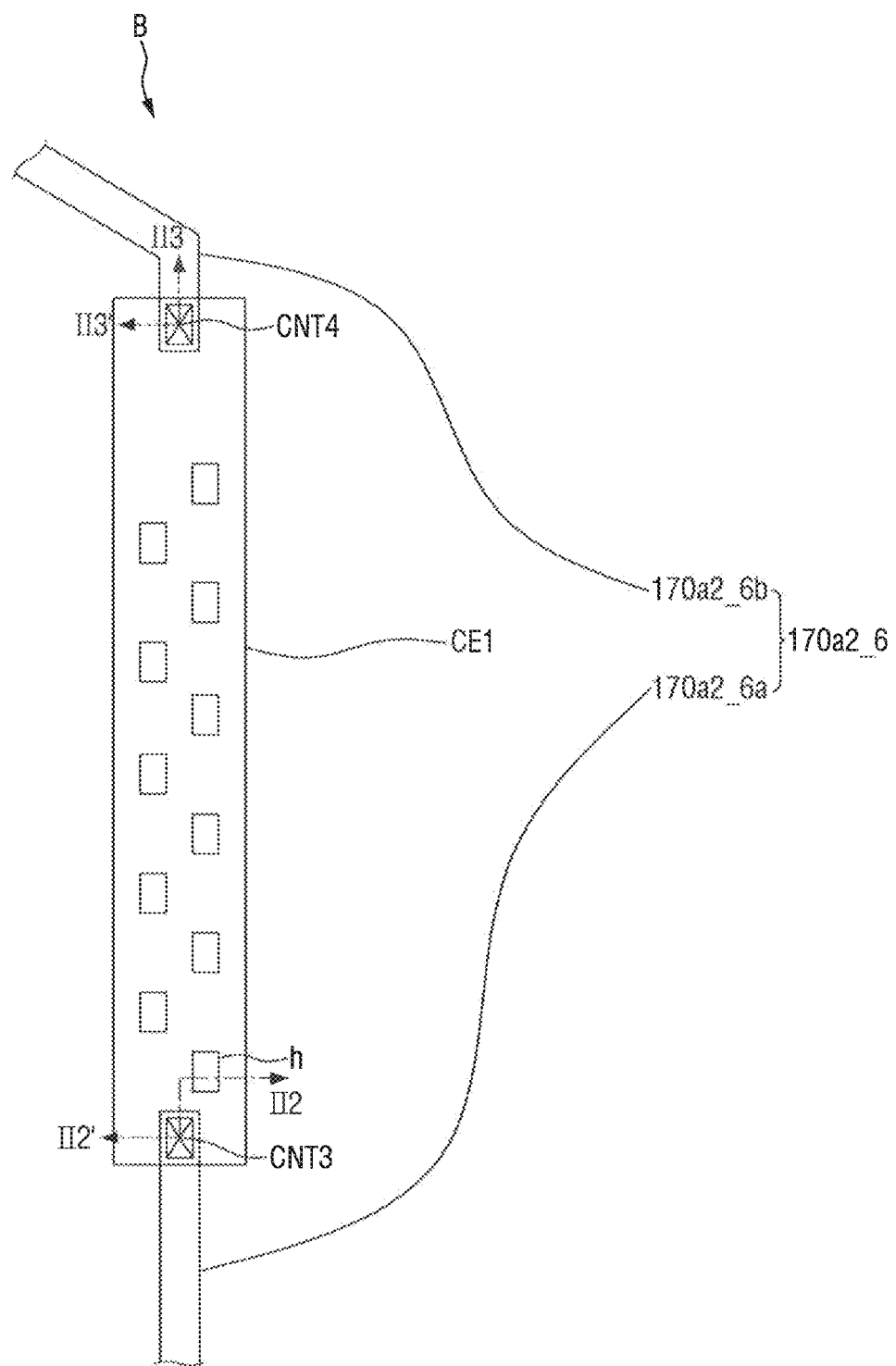
FIG. 15 is an enlarged view of area B shown in FIG. 12 according to an exemplary embodiment of the present invention.
Figure 16:
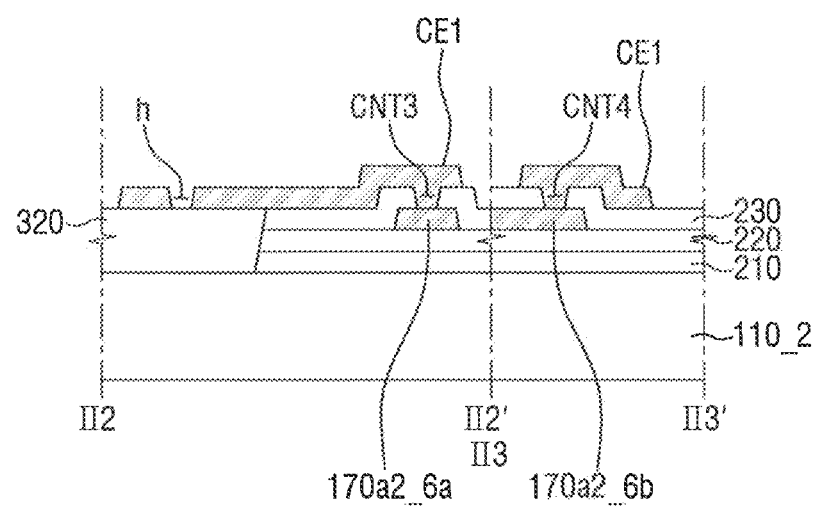
FIG. 16 is a cross-sectional view taken along lines II2-II2' and II3-II3' shown in FIG. 15 according to an exemplary embodiment of the present invention.

FIG. 15 is an enlarged view of area B shown in FIG. 12 according to an exemplary embodiment of the present invention. FIG. 16 is a cross-sectional view taken along lines II2-II2' and II3-II3' shown in FIG. 15 according to an exemplary embodiment of the present invention.

Referring to FIGS. 12, 15 and 16, the second connection line 170a2_6 of the first inspection line 170a_6 may include a first sub-line 170a2_6a disposed between the bending area BA and the driving IC 130, and a second sub-line 170a2_6b disposed between the bending area BA and the display 120.

The first sub-line 170a2_6a may be electrically connected to the second sub-line 170a2_6b via the first connection electrode CE1. For example, the first sub-line 170a2_6a and the second sub-line 170a2_6b may be disposed on the first insulating layer 220. A third contact hole CNT3 exposing at least a part of the first sub-line 170a2_6a, and a fourth contact hole CNT4 exposing at least a part of the second sub-line 170a2_6b may be formed in the second insulating layer 220.

The first connection electrode CE1 may be disposed on a stress relieving layer 320. In other words, the buffer layer 210, the first insulating layer 220 and the second insulating layer 230 may not be disposed in at least a part of the bending area BA. The material contained in the stress relieving layer 320 is not particularly limited as long as it can relieve the stress applied to the first connection electrode CE1 when the bending area BA is bent. In an exemplary embodiment of the present invention, the stress relieving layer 320 may include an organic material.

The first connection electrode CE1 may be in direct contact with the first sub-line 170a2_6a exposed via the third contact hole CNT3 and the second sub-line 170a2_6b exposed via the fourth contact hole CNT4.

In an exemplary embodiment of the present invention, the first connection electrode CE1 disposed in the bending area BA may include a plurality of holes h. The first connection electrode CE1 includes the plurality of holes h. The holes h aid in dispersing the stress applied to the first connection electrode CE1 and in preventing cracks from occurring. It is to be noted that the shape of the first connection electrode CE1 is not limited to that shown in the drawings. For example, the first connection electrode CE1 can have a variety of shapes as long as the first connection electrode CE1 can sufficiently disperse stress.

In FIG. 16, the first connection electrode CE1 is formed on the same layer as the data conductor, and the first connection electrode CE1 is disposed on the stress relieving layer 320. However, this is merely illustrative. In other words, in an alternate embodiment, the first connection electrode CE1 may be formed in the same layer as the gate conductor, or may be formed directly on the first substrate 110_2 without the stress relieving layer 320.

FIGS. 17 to 20 are plan views of display devices according to exemplary embodiments of the present invention.

Figure 17:
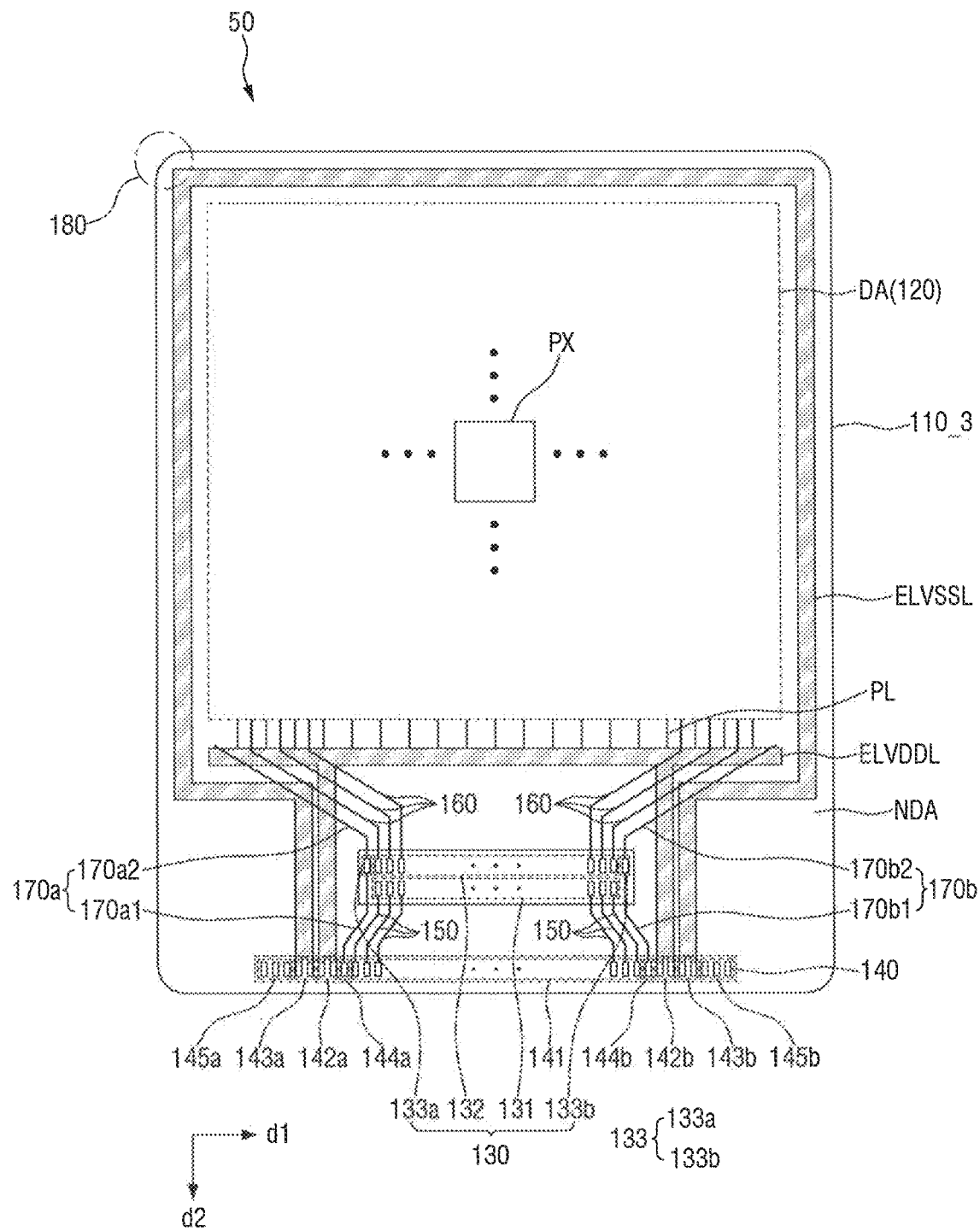
FIGS. 17, 18, 19 and 20 are plan views of a display device according to an exemplary embodiment of the present invention.

Referring to FIG. 17, a first substrate 110_3 may have rounded corners 180. In an exemplary embodiment of the present invention, the corners 180 of the first substrate 110_3 may be formed using a laser. In other words, the display device 50 shown in FIG. 17 is different from the display device 10 shown in FIG. 1 in that the shape of the corners 180 of the first substrate 110_3 is different. The shape of the corners 180 of the first substrate 110_3 is not limited to that shown in FIG. 17. For example, the corners may have any curved shape.

Figure 18:
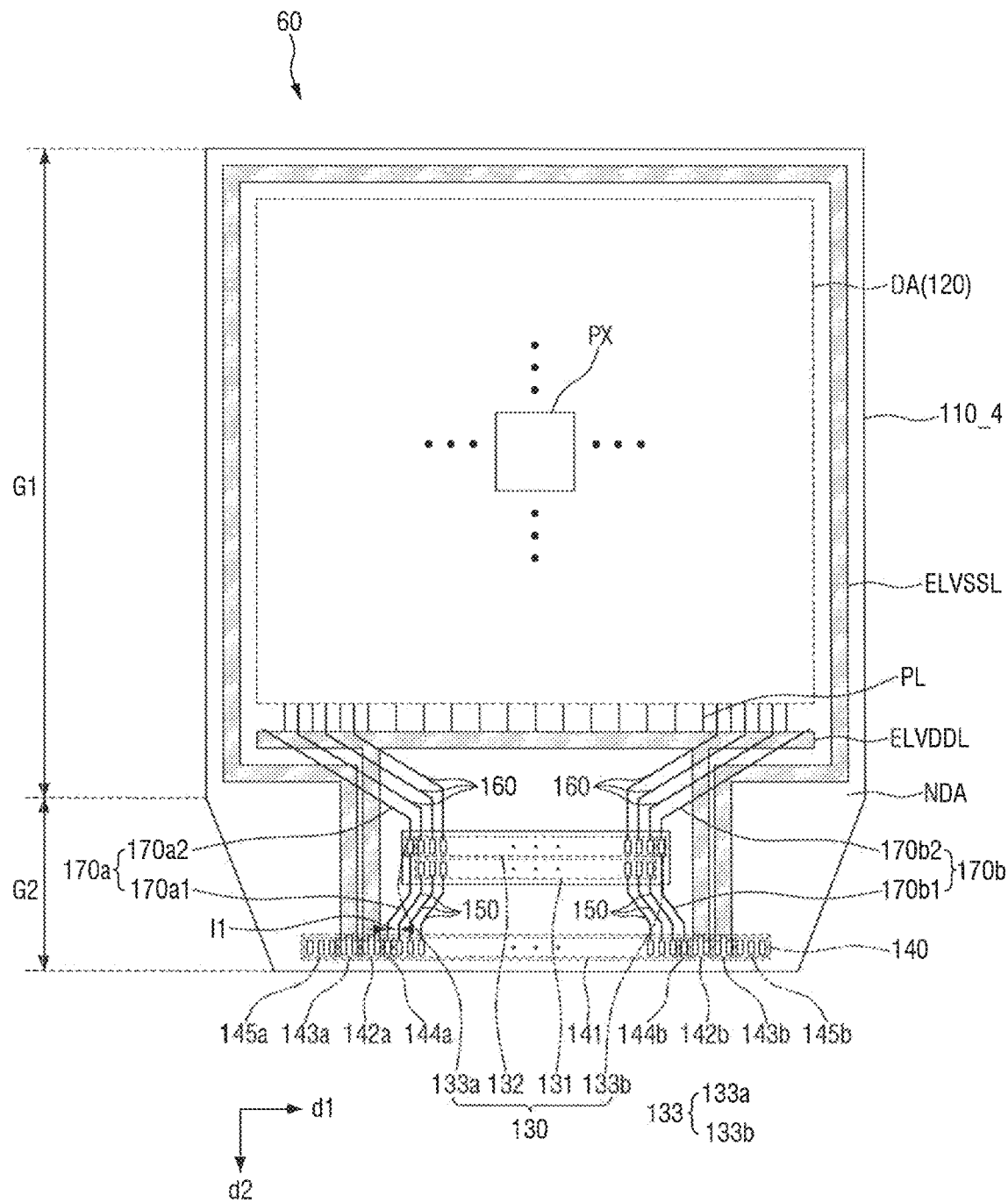

Referring to FIG. 18, a first substrate 110_4 may be divided into a first region G1 and a second region G2. In other words, the display device 60 shown in FIG. 18 is different from the display device 10 shown in FIG. 1 in that the shape of the first substrate 110_4 is different.

The shape of the first region G1 may be substantially rectangular. As used herein, the term "substantially rectangular" may include not only a rectangular shape but also a geometric shape approximating a rectangle. The first region G1 may also be an area with a constant width.

The shape of the second region G2 may be substantially trapezoidal. The second region G2 becomes narrower from the upper half to the lower half of FIG. 18. The second region G2 may be formed by a process of cutting corners using a laser, for example. In other words, the second region G2 may have a narrowing width to reduce interference with other elements when the substrate is coupled with an outer cover.

As the second region G2 becomes narrower from the upper half to the lower half, the spacing between the plurality of conductive lines disposed in the second region G2 may reduced. The first inspection line 170a and the plurality of input lines 150 will be described as an example.

The first connection line 170a1 of the first inspection line 170a is disposed adjacent to the plurality of input lines 150, as described above. Since the second region G2 becomes narrower from the upper half to the lower half, a spacing 11 between the first connection line 170a1 of the first inspection line 170a and the input line closest to the first connection line 170a1 among the plurality of input lines 150 may become smaller. This means that the input line closest to the first connection line 170a1 of the first inspection line 170a is most likely to be vulnerable to static electricity or the like.

In this regard, the first inspection line 170a includes a second connection line 170a2 that extends from the first connection line 170a1 to at least partially overlap the first driving voltage line ELVDDL and/or the second driving voltage line ELVSSL. This increases the resistance or the capacitance of the first inspection line 170a, such that a structure robust against static electricity or the like can be implemented.

Figure 19:
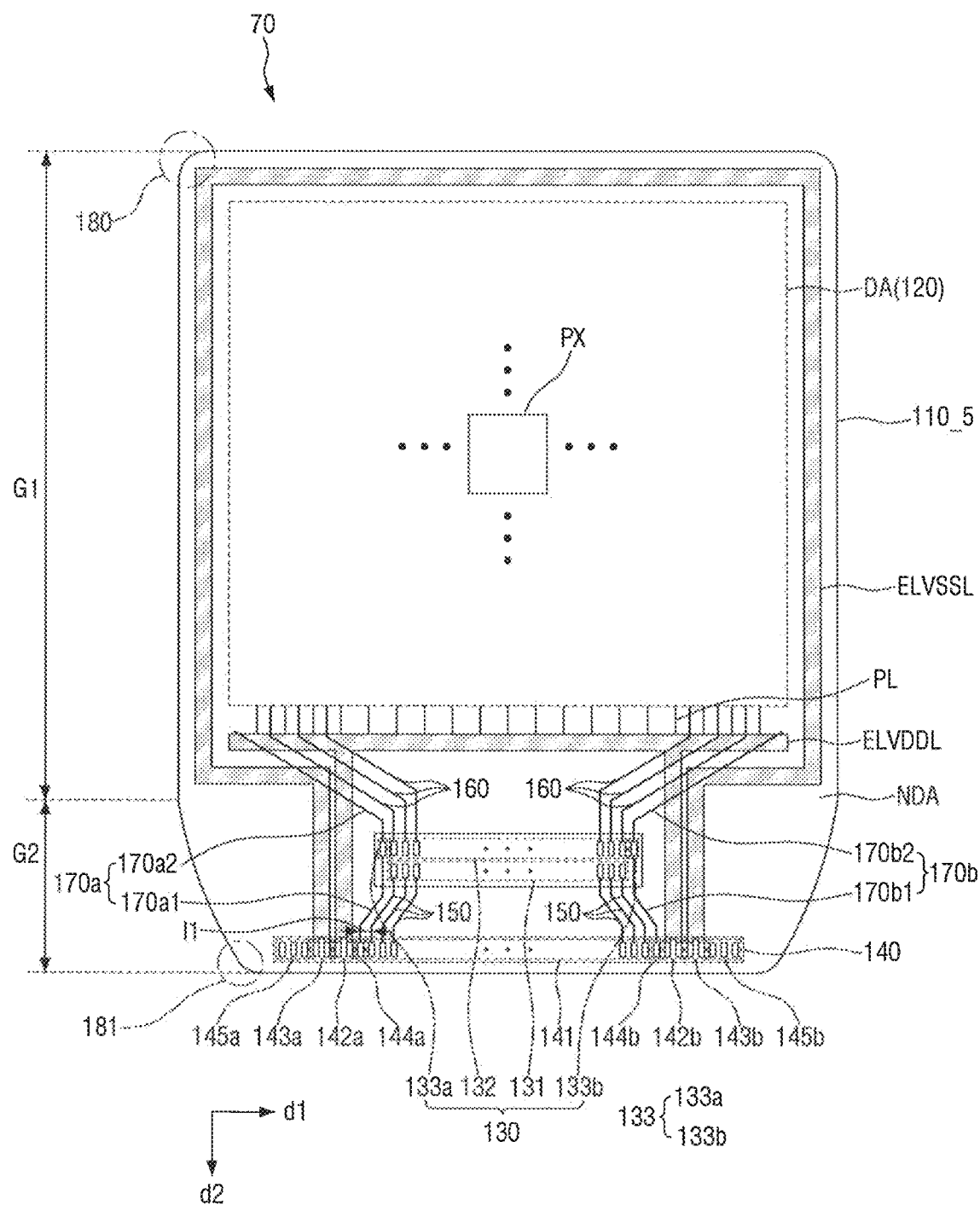

Referring to FIG. 19, a first substrate 110_5 may be divided into a first region G1 and a second region G2 and may have rounded corners 180. In other words, the display device 70 according to the present embodiment is different from the display device 60 shown in FIG. 18 in that the corners 180 are rounded. As shown in FIG. 19, the corners 181 of the second region G2 may be rounded. However, the present invention is not limited thereto.

Figure 20:
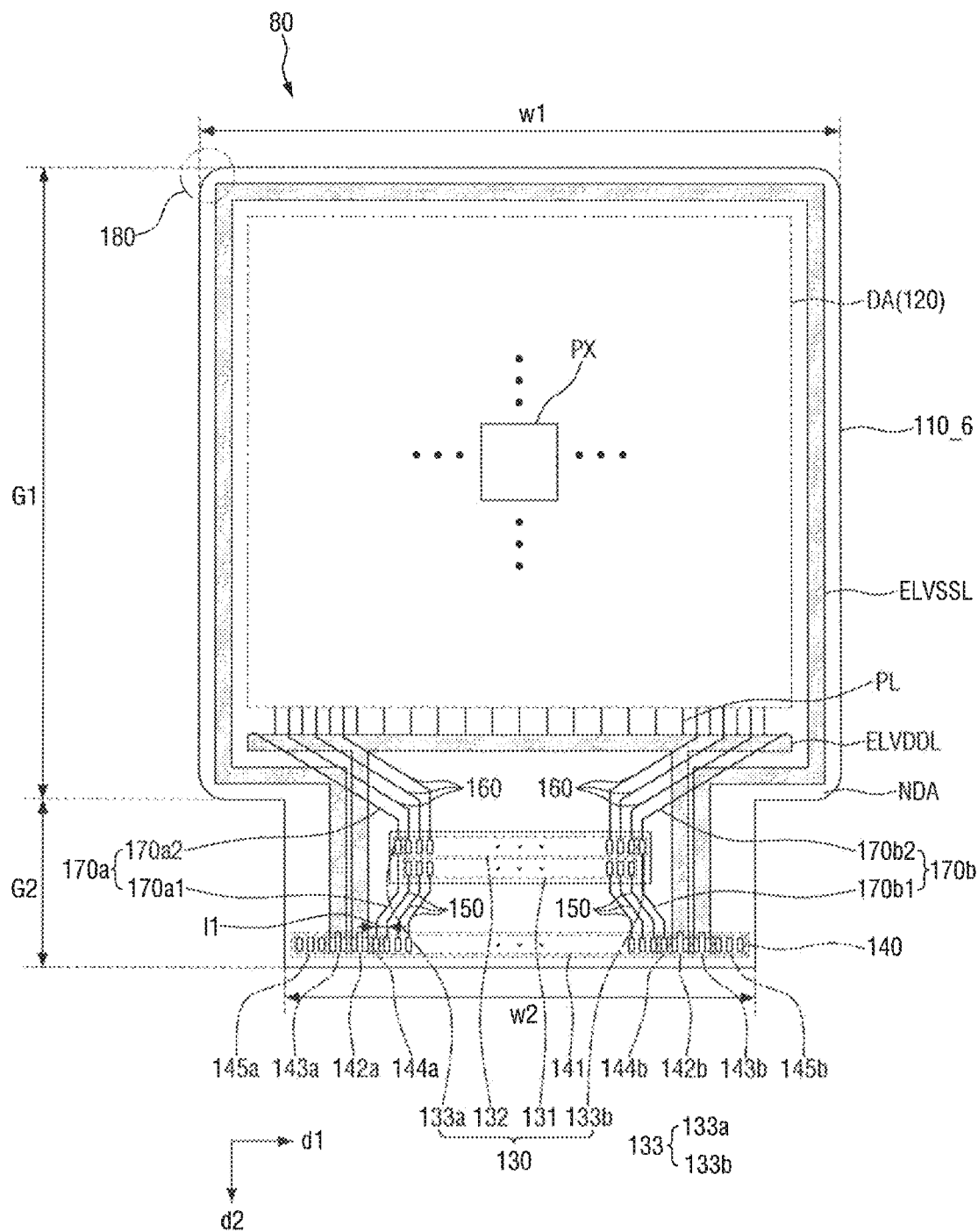

Referring to FIG. 20, a first substrate 110_6 may be divided into a first region G1 and a second region G2.

The first region G1 may have a substantially rectangular shape, with the rounded corners 180. The second region G2 has a substantially rectangular shape, and the area of the second region G2 is smaller than the area of the first region G1. In other words, a first width w1 of the first region G1 is larger than a second width w2 of the second region G2. The shape of the corners of the first and second regions G1 and G2 is not particularly limited.

The display device 80 according to the present embodiment is different from the display device 60 shown in FIG. 18 in that the corners 180 are rounded and the shape of the second region G2 is a rectangle having an area smaller than that of the first region G1.

Figure 21:
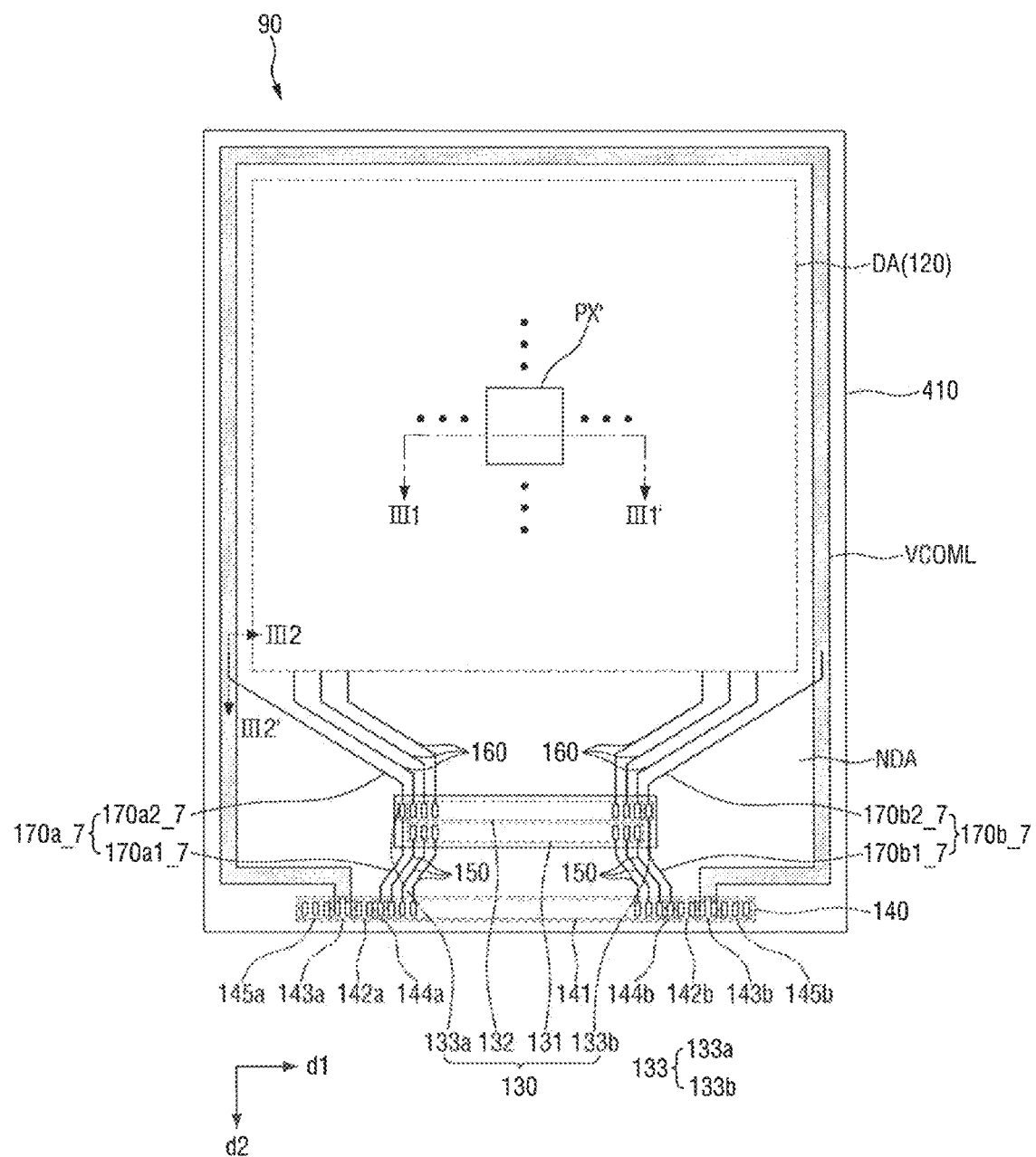
FIG. 21 is a plan view of a display device according to an exemplary embodiment of the present invention.

FIG. 21 is a plan view of a display device according to an exemplary embodiment of the present invention. The elements already described above with respect to FIGS. 1 to 19 may not be described again.

Referring to FIG. 21, a first inspection line 170a_7 may include a first connection line 170a1_7 and a second connection line 170a2_7. The first connection line 170a1_7 of the first inspection line 170a_7 is a line that electrically connects the fourth pad 144a with the first inspection bump 133a. The second connection line 170a2_7 of the first inspection line 170a_7 is a line that extends from the first connection line 170a1_7 toward the display 120 and overlaps at least a part of a common voltage line VCOML, which will be described later. In other words, the second connection line 170a2_7 of the first inspection line 170a_7 overlaps the common voltage line VCOML, thereby forming a capacitor. It is to be noted that the location and size of the area where the second connection line 170a2_7 of the first inspection line 170a_7 overlaps the common voltage line VCOML are not limited to those shown in FIG. 21.

The common voltage line VCOML may provide the display 120 with a common voltage Vcom provided from the output pad unit 140. For example, in an exemplary embodiment of the present invention, the common voltage line VCOML may be electrically connected to the third pad unit 143a and 143b of the output pad unit 140. Accordingly, the common voltage line VCOML may receive the common voltage Vcom from the third pad unit 143a and 143b. In addition, in an exemplary embodiment of the present invention, the common voltage line VCOML may be electrically connected to a common electrode 490 (see FIG. 23), which will be described later, in the non-display area NDA. Thus, the common voltage line VCOML can provide the common voltage Vcom to the common electrode 490. In an exemplary embodiment of the present invention, the common voltage Vcom may be a DC voltage.

In an alternate embodiment of the present invention, the common voltage line VCOML may receive the common voltage from another pad unit such as the fifth pad unit 145a and 145b of the output pad unit 140, for example.

The common voltage line VCOML may be disposed on the first substrate 410 such that it at least partially surrounds the non-display area NDA. In an exemplary embodiment of the present invention, the common voltage line VCOML may be disposed at four sides of the display area DA, as shown in FIG. 21.

Figure 22:
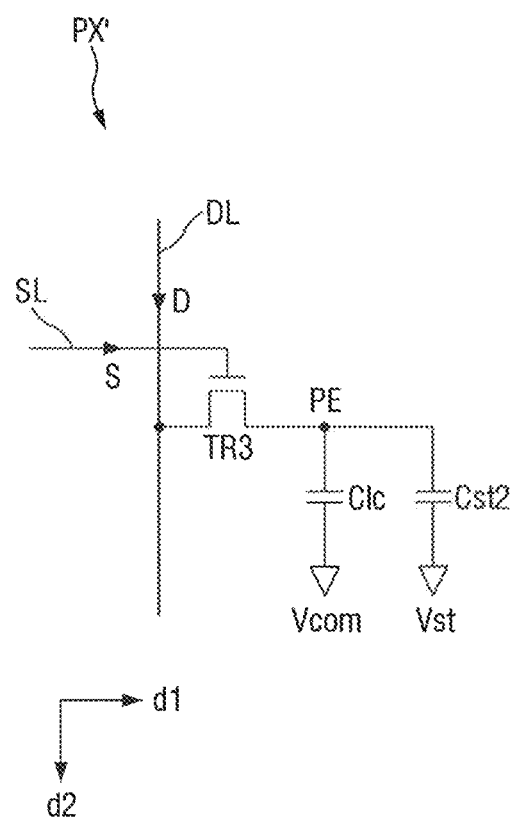
FIG. 22 is an equivalent circuit diagram of the pixel shown in FIG. 17 according to an exemplary embodiment of the present invention.
Figure 23:
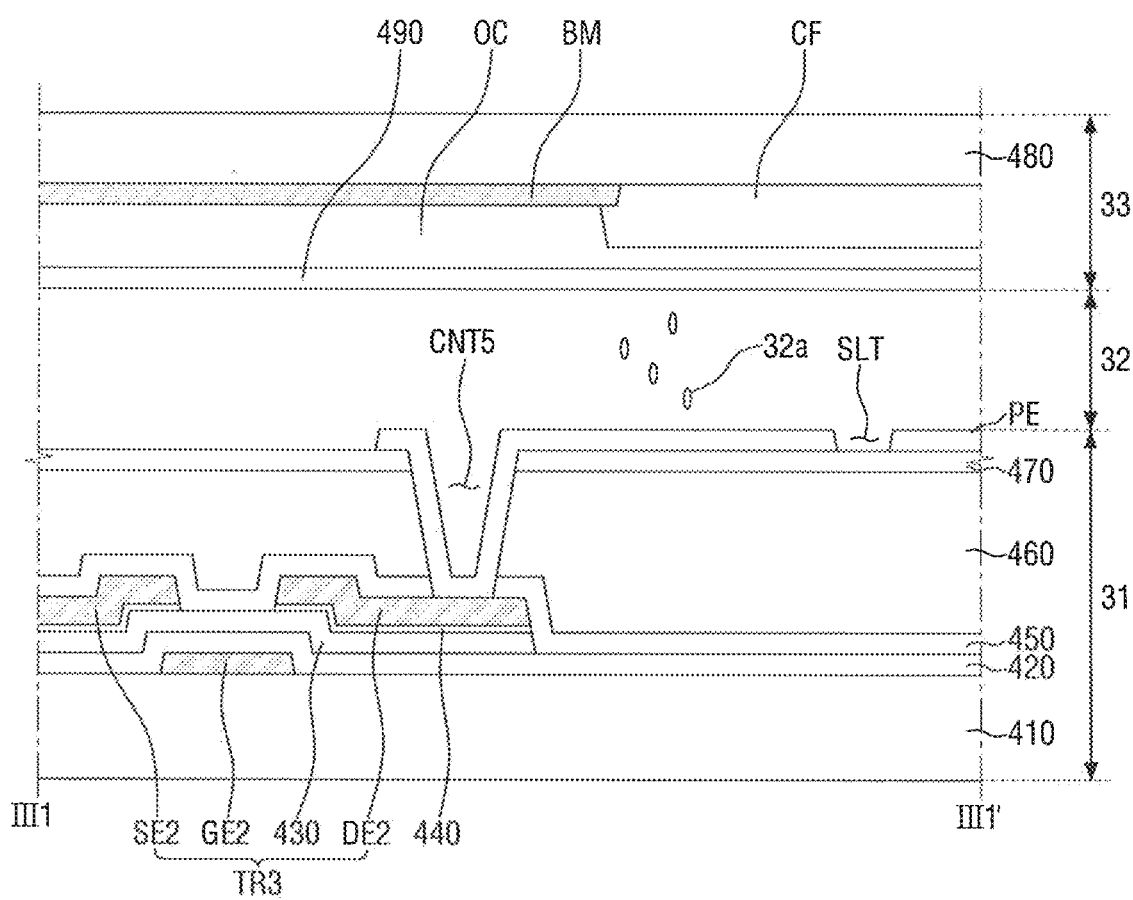
FIG. 23 is a cross-sectional view taken along line III1-III1' shown in FIG. 17 according to an exemplary embodiment of the present invention.

Referring to FIGS. 22 and 23, a pixel PX' will be described. FIG. 22 is an equivalent circuit diagram of the pixel shown in FIG. 21 according to an exemplary embodiment of the present invention. FIG. 23 is a cross-sectional view taken along line III1-III1' shown in FIG. 21 according to an exemplary embodiment of the present invention.

Referring to FIG. 22, the pixel PX' may include a switching element TR3, a pixel electrode PE, a liquid-crystal capacitor Clc, and a storage capacitor Cst2. In other words, the display device 90 according to this exemplary embodiment may be a liquid-crystal display device.

The switching element TR3 may be electrically connected to a scan line SL, a data line DL, and the pixel electrode PE. In an exemplary embodiment of the present invention, the switching element TR3 may be an element having three terminals such as a thin-film transistor. The control electrode (e.g., first electrode) of the switching element TR3 may be connected to the scan line SL, and another electrode (e.g., second electrode) of the switching element TR3 may be connected to the data line DL. Yet another electrode (e.g., third electrode) of the switching element TR3 may be connected to the pixel electrode PE.

The switching element TR3 may be turned on in response to the scan signal S provided from the scan line SL1 and may provide the data signal D supplied from the data line DL to the pixel electrode PE.

The pixel electrode PE may be capacitively coupled to the common electrode 490 (see FIG. 23) that provides the common voltage Vcom. In other words, a liquid-crystal capacitor Clc may be formed between the pixel electrode PE and the common electrode 490. In other words, the display device 90 shown in FIG. 21 is a liquid-crystal display device.

One electrode of the storage capacitor Cst2 may be electrically connected to the pixel electrode PE while the other electrode of the storage capacitor Cst2 may be electrically connected to the storage electrode that receives a storage voltage Vst.

It is to be noted that the pixel PX' is not limited to that shown in FIG. 22. In an exemplary embodiment of the present invention, in addition to the switching element TR3, the pixel PX' may further include a plurality of switching elements for increasing visibility and the like.

Referring to FIG. 23, the stack structure of the elements included in the pixel PX' will be described in more detail.

Referring to FIG. 23, the display device 90 according to an exemplary embodiment of the present invention may include a bottom plate 31, a liquid-crystal layer 32, and a top plate 33. The bottom plate 31 may be attached to the top plate 33 by sealing. The bottom plate 31 may face the top plate 33, and the liquid-crystal layer 32 containing liquid crystal molecules 32a may be interposed between the bottom plate 31 and the top plate 33.

The bottom plate 31 will be described first.

In an exemplary embodiment of the present invention, a lower substrate 410 may be a glass or plastic substrate.

On the lower substrate 410, a gate conductor including a gate electrode GE2 and a scan line SL may be disposed. The gate electrode GE2 may extend from the scan line SL and overlap a semiconductor pattern 430.

A gate insulating layer 420 may be disposed on the gate conductor including the gate electrode GE2. The gate insulating layer 420 may be made of: an inorganic insulative material such as silicon oxide (SiOx) or silicon nitride (SiNx); an organic insulative material such as benzocyclobutene (BCB), an acryl-based material or polyimide; or a mixture thereof.

The semiconductor layer including the semiconductor pattern 430 may be disposed on the gate insulating layer 420. The semiconductor pattern 430 will be described as an example of the semiconductor layer. The semiconductor pattern 430 may be disposed on the gate insulating layer 420. The semiconductor pattern 430 may form a channel region of the switching element TR3.

In an exemplary embodiment of the present invention, the semiconductor pattern 430 may include an oxide semiconductor. For example, the semiconductor pattern 430 may be made of an oxide semiconductor including: IGZO(In—Ga-Zinc-Oxide), ZnO, $ZnO_2$, CdO, SrO, $SrO_2$, CaO, $CaO_2$, MgO, $MgO_2$, InO, $In_2O_2$, GaO, $Ga_2O$, $Ga_2O_3$, SnO, $SnO_2$, GeO, $GeO_2$, PbO, $Pb_2O_3$, $Pb_3O_4$, TiO, $TiO_2$, $Ti_2O_3$, or $Ti_3O_5$. In an exemplary embodiment of the present invention, the semiconductor pattern 430 may be made of amorphous silicon, polycrystalline silicon, etc.

An ohmic contact layer 440 may be disposed on the semiconductor pattern 430. The ohmic contact layer 440 may be made of a material highly doped with an n-type impurity such as phosphorus, e.g., n+ hydrogenated amorphous silicon, or may be made of silicide. The ohmic contact layer 440 may not be included when the semiconductor pattern 430 is made of an oxide semiconductor.

The data conductor including the source electrode SE2, the drain electrode DE2 and the data line DL may be disposed on the ohmic contact layer 440 and the gate insulating layer 420. The data conductor may include the common voltage line VCOML. In other words, the data conductor may be formed via the same mask process as the common voltage line VCOML.

In addition, the data conductor may also be formed together with the semiconductor layer including the semiconductor pattern 430 and the ohmic contact layer 440 via the same mask process. In this case, the data line DL, the source electrode SE2, and the drain electrode DE2 may have substantially the same shape as the semiconductor layer except for the semiconductor pattern 430 when viewed from the top.

The semiconductor pattern 430, the gate electrode GE2, the source electrode SE2 and the drain electrode DE2 form the switching element TR3.

A first passivation film 450 may be disposed on the data conductor. In an exemplary embodiment of the present invention, the first passivation layer 450 may be made of an inorganic insulation material such as silicon nitride or silicon oxide. The first passivation layer 450 can prevent the pigment of an organic insulating layer 460, which will be described later, from flowing into the semiconductor pattern 430.

The organic insulating layer 460 may be disposed on the first passivation layer 450. The organic insulation layer 460 may include an organic material that is suitable for a flat surface and has photosensitivity. The organic insulating layer 460 may not be included in the display device 90.

A second passivation layer 470 may be disposed on the organic insulating layer 460. In an exemplary embodiment of the present invention, the second passivation layer 470 may be made of an inorganic insulation material such as silicon nitride or silicon oxide.

The pixel electrode PE may be disposed on the second passivation layer 470. At least a part of the pixel electrode PE overlaps the common electrode 490. By doing so, a fringe field is formed so that the liquid-crystal molecules 33a can be rotated in a particular direction. The pixel electrode PE may be made of a transparent conductive material such as ITO or IZO, or a reflective metal such as aluminum, silver, chrome or an alloy thereof. In an exemplary embodiment of the present invention, the pixel electrode PE may include a plurality of slits SLT.

The pixel electrode PE may be connected to the drain electrode DE2 of the switching element TR3 exposed via a fifth contact hole CNT5.

The bottom plate 31 may further include a shielding electrode that is disposed on the same layer as the pixel electrode PE and is capable of preventing light leakage due to coupling with the pixel electrode PE. In addition, the bottom plate 31 may be disposed on the pixel electrode PE, and may further include a lower alignment layer formed of polyimide or the like.

Next, the top plate 33 will be described.

An upper substrate 480 may be opposite the lower substrate 410. The upper substrate 480 may be made of transparent glass, plastic, etc., and, for example, may be made of the same material as the lower substrate 410.

A black matrix BM may be disposed on the upper substrate 480 to block light from being transmitted out of the pixels PX'. In an exemplary embodiment of the present invention, the black matrix BM may be made of an organic material or a metallic material including chrome.

A color filter CF may be disposed on the upper substrate 480 and the black matrix BM. The color filter CF may be used to reproduce one of the primary colors, e.g., red, green and blue. The color filter CF may be disposed on the bottom plate 31.

An overcoat layer OC may be disposed on the color filter CF. The overcoat layer OC may be formed of an insulating material and provide a flat surface over the common electrode 490. The overcoat layer OC may not be included in some implementations.

The common electrode 490 may be disposed on the overcoat layer OC. The common electrode 490 may overlap the pixel electrode PE. In an exemplary embodiment of the present invention, the common electrode 490 may be formed over the entire surface of the upper substrate 480. In addition, the common electrode 490 may include a plurality of slits. The common electrode 490 may be made of a transparent conductive material such as ITO or IZO, or a reflective metal such as aluminum, silver, chrome or an alloy thereof. The common electrode 490 may also be disposed on the bottom plate 31. In this case, the pixel electrode PE and the common electrode 490 may overlap each other in the direction perpendicular to the lower substrate 410, or may overlap each other in the direction parallel to the lower substrate 410, thereby forming a fringe field.

The top plate 33 may be disposed on the common electrode 490, and may further include an upper alignment layer formed of polyimide or the like, for example.

Hereinafter, the structure in which the common voltage line VCOML overlaps the second connection line 170a2_7 of the first inspection line 170a_7 will be described in more detail with reference to FIG. 24.

Figure 24:
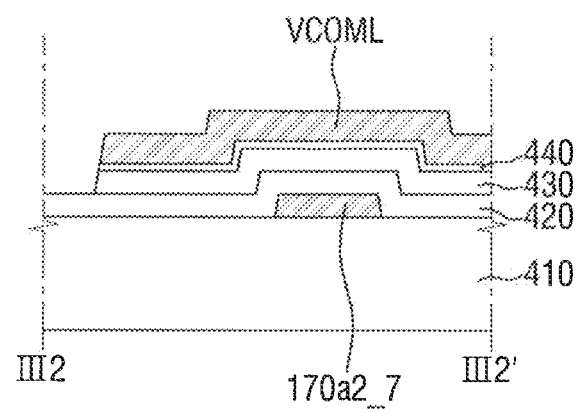
FIG. 24 is a cross-sectional view taken along line III2-III2' shown in FIG. 17 according to an exemplary embodiment of the present invention.

FIG. 24 is a cross-sectional view taken along line III2-III2' shown in FIG. 21 according to an exemplary embodiment of the present invention.

Referring to FIG. 24, the second connection line 170a2_7 of the first inspection line 170a_7 may be disposed on the lower substrate 410. In other words, the second connection line 170a2_7 of the first inspection line 170a_7 may be disposed on the same layer as the gate conductor including the gate electrode GE2. In addition, the second connection line 170a2_7 of the first inspection line 170a_7 may be formed together with the gate conductor via the same mask process.

In an exemplary embodiment of the present invention, the common voltage line VCOML may be disposed on the ohmic contact layer 440. In other words, the common voltage line VCOML may be disposed on the same layer as the data line DL, the source electrode SE2, and the drain electrode DE2. In an exemplary embodiment of the present invention, the common voltage line VCOML may be formed together with the data conductor including the semiconductor pattern 430, the ohmic contact layer 440, the data line DL, the source electrode SE2 and the drain electrode DE2 via the same mask process.

The common voltage line VCOML is disposed on the second connection line 170a2_7 of the first inspection line 170a_7 and at least partially overlaps the second connection line 170a2_7 of the first inspection line 170a_7, thereby forming a capacitor with the second connection line 170a2_7.

The first inspection line 170a_7 includes the second connection line 170a2_7 extending from the first connection line 170a1, thereby increasing the overall resistance of the first inspection line 170a1_7. Further, the second connection line 170a2__7 of the first inspection line 170a_7 at least partially overlaps the common voltage line VCOML, thereby increasing the capacitance of the first inspection line 170a_7.

By doing so, the structure robust against static electricity or a large amount of electric charges can be implemented. Therefore, static electricity that may flow into the output bump unit 132 can be suppressed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
   a first substrate comprising a display area and a non-display area adjacent to the display area, wherein the display area includes a plurality of pixels;
   an output pad unit disposed in the non-display area and comprising an inspection pad and a driving voltage pad;
   a driving integrated circuit (IC) disposed in the non-display area and comprising an inspection bump;
   a driving voltage line electrically connected to the plurality of pixels and the driving voltage pad; and
   an inspection line having a first connection line and a second connection line, wherein the first connection line is directly connected between the inspection pad and the inspection bump, and the second connection line is electrically connected only to the inspection bump and partially overlaps the driving voltage line,
   wherein a capacitor is formed between the driving voltage line and the second connection line in an overlapping area in which the second connection line overlaps the driving voltage line.

2. The display device of claim 1, wherein the driving IC further comprises an input bump unit electrically connected to the output pad unit, and an output bump unit electrically connected to the plurality of pixels, and
   wherein the inspection bump is adjacent to the output bump unit.

3. The display device of claim 1, further comprising: a second substrate facing the first substrate,
   wherein the second substrate is a glass insulation substrate.

4. The display device of claim 1, further comprising: an encapsulation layer covering the plurality of pixels,
wherein the encapsulation layer comprises an organic layer or an inorganic layer.

5. The display device of claim 1, wherein the driving voltage line comprises a first driving voltage line for receiving a first driving voltage, and a second driving voltage line for receiving a second driving voltage, wherein a voltage level of the second driving voltage is lower than a voltage level of the first driving voltage.

6. The display device of claim 5, wherein the second connection line overlaps the first driving voltage line or the second driving voltage line.

7. The display device of claim 5, wherein at least one of the pixels comprises a first switching element and an organic light-emitting diode connected to the first switching element,
wherein the first switching element has a first electrode connected to the first driving voltage line and a second electrode connected to the organic light-emitting diode, and
wherein the organic light-emitting diode has a third electrode connected to the second electrode of the first switching element, and a fourth electrode connected to the second driving voltage line.

8. The display device of claim 1, wherein at least one of the of pixels comprises a pixel electrode, a common electrode capacitively coupled to the pixel electrode, and a liquid-crystal layer interposed between the pixel electrode and the common electrode, and
wherein the common electrode is electrically connected to the driving voltage line.

9. The display device of claim 1, wherein the driving voltage line is disposed on a layer different from a layer where the inspection line is disposed.

10. The display device of claim 1, wherein the second connection line comprises a bent portion.

11. The display device of claim 1, wherein the first substrate further comprises a bending area overlapping the non-display area, and
wherein the first substrate is bent in the bending area.

12. A display device, comprising:
a first substrate comprising a display area and a non-display area adjacent to the display area, wherein the display area includes a plurality of pixels;
an output pad unit disposed in the non-display area and comprising an inspection pad and a driving voltage pad;
a driving integrated circuit (IC) disposed in the non-display area and comprising an inspection bump;
a driving voltage line electrically connected to the plurality of pixels and the driving voltage pad; and
an inspection line having a first connection line and a second connection line, wherein the first connection line is electrically connected to the inspection pad and the inspection bump, and the second connection line is electrically connected to the inspection bump and partially overlaps the driving voltage line,
wherein the first substrate further comprises a bending area overlapping the non-display area, and
wherein the first substrate is bent in the bending area,
the display device further comprising: a connection electrode disposed in the bending area,
wherein the second connection line comprises a first sub-line and a second sub-line electrically connected to each other via the connection electrode.

13. A display device, comprising:
a first substrate comprising a display area and a non-display area adjacent to the display area, wherein the display area includes a display;
an output pad unit disposed in the non-display area and comprising an inspection pad;
a driving integrated circuit (IC) disposed in the non-display area between the output pad unit and the display and comprising an inspection bump; and
an inspection line disposed in the non-display area and electrically connected to the inspection bump,
wherein the inspection line comprises a first connection line and a second connection line, wherein the first connection line is directly connected to the inspection bump and the inspection pad, and the second connection line is electrically connected only to the inspection bump and extends away from the inspection bump to an area between the driving IC and the display.

14. The display device of claim 13, further comprising: a driving voltage line disposed on the first substrate and electrically connected to a plurality of pixels included in the display,
wherein the output pad unit further comprises a driving voltage pad electrically connected to the driving voltage line.

15. The display device of claim 14, wherein the second connection line partially overlaps the driving voltage line.

16. The display device of claim 14, wherein the driving voltage line comprises a first driving voltage line for providing a first driving voltage, and a second driving voltage line for providing a second driving voltage, a voltage level of the first driving voltage is different from a voltage level of the second driving voltage, and
wherein the second connection line overlaps the first driving voltage line or the second driving voltage line.

17. The display device of claim 14, wherein the inspection line is disposed on a layer different from a layer where the driving voltage line is disposed.

18. The display device of claim 13, wherein the driving IC further comprises an output bump unit for providing a driving signal to the display, and an inspection bump electrically connected to the inspection line, and
wherein the inspection bump is adjacent to the output bump unit.

19. The display device of claim 13, further comprising: an encapsulation element covering the display,
wherein the encapsulation element comprises an organic layer or an inorganic layer, or is a glass insulation substrate.

20. The display device of claim 13, further comprising:
a second substrate facing the first substrate; and
a liquid-crystal layer interposed between the first substrate and the second substrate.

* * * * *